US008168499B2

(12) United States Patent
Koyama et al.

(10) Patent No.: US 8,168,499 B2
(45) Date of Patent: May 1, 2012

(54) SEMICONDUCTOR DEVICE AND METHOD FOR MANUFACTURING THE SAME

(75) Inventors: Masato Koyama, Kanagawa-Ken (JP); Yoshinori Tsuchiya, Yokohama (JP); Seiji Inumiya, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 194 days.

(21) Appl. No.: 12/662,581

(22) Filed: Apr. 23, 2010

(65) Prior Publication Data

US 2010/0210100 A1     Aug. 19, 2010

Related U.S. Application Data

(63) Continuation of application No. 11/907,353, filed on Oct. 11, 2007, now Pat. No. 7,727,832.

(30) Foreign Application Priority Data

Feb. 5, 2007   (JP) .................................. 2007-25653

(51) Int. Cl.
*H01L 21/8234* (2006.01)
(52) U.S. Cl. .......... 438/275; 257/E21.632; 257/E21.636; 257/E21.637
(58) Field of Classification Search .................. 438/275; 257/E21.632, E21.636, E21.637
See application file for complete search history.

(56) References Cited

U.S. PATENT DOCUMENTS

| 2006/0035427 A1 | 2/2006 | Kudo et al. |
| 2007/0145493 A1 | 6/2007 | Koyama et al. |
| 2007/0210351 A1 | 9/2007 | Tsuchiya et al. |
| 2007/0221970 A1 | 9/2007 | Kadoshima et al. |
| 2008/0029822 A1 | 2/2008 | Tsuchiya et al. |

OTHER PUBLICATIONS

Tsuchiya et al., "Practical Work Function Tuning Based on Physical and Chemical Nature of Interfacial Impurity in Ni-FUSI/SiON and HfSiON Systems," IEDM 2006, pp. 231-234, (2006).
Takahashi et al., "Dual Workfunction Ni-Silicide/HfSiON Gate Stacks by Phase-Controlled Full-Silicidation (PC-FUSI) Technique for 45nm-node LSTP and lop Devices," IEDM Tech. Dig., pp. 91-94, (2004).
Kim et al., "Systematic Study of Workfunction Engineering and Scavenging Effect Using NiSi Alloy FUSI Metal Gates with Advanced Gate Stacks," IEDM Tech. Dig., pp. 657-660, (2005).
Tsuchiya et al., U.S. Appl. No. 11/871,570, filed Oct. 12, 2007.
Veloso et al., 2006 Symposium on VLSI Technology, Digest of Technical Papers, pp. 94-95.
Tsuchiya et al., Journal of Applied Physics, 2009, 106, 044510-1 to 044510-8.

*Primary Examiner* — David S Blum
(74) *Attorney, Agent, or Firm* — Finnegan, Henderson, Farabow, Garrett & Dunner, L.L.P.

(57) ABSTRACT

It is made possible to provide a method for manufacturing a semiconductor device that includes CMISs each having a low threshold voltage Vth and a Ni-FUSI/SiON or high-k gate insulating film structure. The method comprises: forming a p-type semiconductor region and an n-type semiconductor region insulated from each other in a substrate; forming a first and second gate insulating films on the p-type and n-type semiconductor regions, respectively; forming a first nickel silicide having a composition of Ni/Si<31/12 above the first gate insulating film, and a second nickel silicide having a composition of Ni/Si≧31/12 on the second gate insulating film; and segregating aluminum at an interface between the first nickel silicide and the first gate insulating film by diffusing aluminum through the first nickel silicide.

22 Claims, 17 Drawing Sheets

| METAL ELEMENT | OXIDE FORMATION ENERGY (kcal) |
|---|---|
| Ti | −944.0 |
| Zr | −1100.6 |
| Hf | −1144.7 |
| Si | −910.7 |

SEMICONDUCTOR DEVICE AND METHOD FOR MANUFACTURING THE SAME

CROSS-REFERENCE TO RELATED APPLICATION

This is a continuation of application Ser. No. 11/907,353, now U.S. Pat. No. 7,727,832, filed Oct. 11, 2007, which is incorporated herein by reference.

BACKGROUND OF THE INVENTION

1. Field of the Invention

The present invention relates to a semiconductor device having MISFETs and a method for manufacturing the semiconductor device.

2. Related Art

"Silicon large-scale integrated circuit" is one of the fundamental device technologies that will support the advanced information society in the future. To achieve high performances from integrated circuits, it is necessary to produce highly sophisticated semiconductor elements such as MISFETs (Metal-Insulator-Semiconductor Field Effect Transistors) and CMISFETs (Complementary MISFETs) that serve as the components of the integrated circuits. Conventionally, the sophistication of devices has been achieved by the scaling rule. In recent years, however, it is difficult to achieve high performances by making devices smaller, due to various physical limitations.

For example, with gate electrodes formed with silicon, there have been problems that the gate parasitic resistance becomes higher as the device operation speed increases, the effective insulating film capacitance becomes smaller due to carrier depletion caused in the interface with each insulating film, and the threshold voltage varies due to penetration of impurities into the channel region.

There have been so-called metal gate techniques by which a metal material in place of silicon is used for the gate electrode. By the metal gate techniques, the gate parasitic resistance can be made lower, the carrier depletion can be restrained, and the penetration of impurities can be restrained. As those effects can be simultaneously achieved, the MISFET performance is dramatically improved.

One of the metal gate techniques is the full-silicide gate electrode technique (hereinafter referred to as the FUSI technique) by which the entire gate electrode made of silicon is silicided with Ni or the like. By the FUSI technique, after the source/drain regions and the likes of a transistor are formed through the same procedures as those of the conventional silicon gate technique, all the silicon is turned into silicide so as to obtain the function of a metal gate. Therefore, the FUSI technique is considered to be a very practical metal gate technique.

Meanwhile, $SiO_2$, which has been used as the gate insulating film material, is recently considered to become unable to satisfy the demand for thinner films. Therefore, there is a technique by which nitrogen is added to $SiO_2$ so as to increase the relative permittivity and reduce the leakage current. In short, by this technique, SiON is used as the gate insulating film. With such a gate insulating film, a more sophisticated CMISFET is realized. Further, employment of a gate insulating film made of a so-called high-k material that has higher relative permittivity than SiON is being considered. For such a high-k gate insulating film, materials such as $HfO_2$ and HfSiON are considered to be practical.

For future CMISFETs, combining the FUSI technique and the SiON or high-k gate insulating film technique is essential. By combining those two techniques, future LSIs that can operate at high speeds and consume less power can be realized.

The FUSI technique using nickel is the most practical (hereinafter referred to as the Ni-FUSI technique). In a case where CMISs are formed by combining the Ni-FUSI technique with a practical high-k gate insulating film such as a SiON film, a $HfO_2$ film, or a HfSiON film, the threshold voltage Vth is set at a low value. Therefore, the work function of Ni-FUSI needs to be adjusted to values suitable for the n-channel MIS transistor and the p-channel MIS transistor, respectively. The most popular technique is the technique of modulating the Ni-FUSI composition and the Ni/Si ratio (the composition modulating Ni-FUSI technique, disclosed by K. Takahashi et al., "Dual Workfunction Ni-Silicide/HfSiON Gate Stacks by Phase-Controlled Full-Silicidation (PC-FUSI) Technique for 45 nm-node LSTP and LOP Devices", 2004 IEDM, p.p. 91-94, for example). By this technique, the Ni-FUSI of the n-channel MIS transistor is made rich in silicon, and the Ni-FUSI of the p-channel MIS transistor is made rich in nickel. With this arrangement, the threshold voltage Vth of each CMIS can be easily adjusted.

However, the biggest problem in the composition modulating Ni-FUSI technique is that a high-temperature process is required as the solid phase reaction temperature for the silicon-rich $NiSi_2$ required for the n-channel MIS transistor is 650° C. or higher. Since the nickel silicide is formed after the source/drain portions of the transistor are formed by the Ni-FUSI technique, the silicide forming temperature needs to be so low as not to degrade the electrode silicides of the source and drain or the impurity profile in the channel. A process at the temperature of 650° C. does not satisfy this requirement.

As a technique for forming the Ni-FUSI of the n-channel MIS transistor at a low temperature, there is the Ni—Al silicidation technique by which a solid phase reaction is caused between silicon and a mixed film of nickel and aluminum, so as to segregate aluminum in the interface between nickel silicide and the gate insulating film that is a $HfO_2$ film in this case. By this technique, a low work function suitable for adjusting the threshold voltage Vth of the n-channel MIS transistor can be realized (see Y. H. Kim et al., "Systematic Study of Workfunction Engineering and Scavenging Effect Using NiSi Alloy FUSI Metal Gates with Advanced Gate Stacks", 2005 IEDM, p.p. 657-660, for example). By this technique, the Ni-FUSI of the n-channel MIS transistor can be formed at a low temperature that is allowable in practice. By the Ni—Al silicidation technique, however, there is the need to form a Ni—Al alloy only on the n-channel MIS transistor, resulting in more complicated manufacturing procedures.

As described above, there has been the problem that the processing temperature is too high to reduce the threshold voltage Vth of the CMIS transistors forming the Ni-FUSI/SiON or high-k gate insulating film structure by the composition modulating Ni-FUSI technique that is the most popular technique, where a lower threshold voltage Vth is necessary to produce future high-speed semiconductors that consume less power. There also has been the problem that the manufacturing procedures become more complicated by the Ni—Al silicidation technique.

SUMMARY OF THE INVENTION

The present invention has been made in view of these circumstances, and an object thereof is to provide a semiconductor device that includes CMISs each having a low threshold voltage Vth and a Ni-FUSI/SiON or high-k gate insulating film structure that can be easily manufactured, and a method for manufacturing the semiconductor device.

A method for manufacturing a semiconductor device according to a first aspect of the present invention includes: forming a p-type semiconductor region and an n-type semiconductor region insulated from each other in a substrate; forming a first and second gate insulating films on the p-type and n-type semiconductor regions, respectively; forming a first nickel silicide having a composition of Ni/Si<31/12 above the first gate insulating film, and a second nickel silicide having a composition of Ni/Si≧31/12 on the second gate insulating film; and segregating aluminum at an interface between the first nickel silicide and the first gate insulating film by diffusing aluminum through the first nickel silicide.

A method for manufacturing a semiconductor device according to a second aspect of the present invention includes: forming a p-type semiconductor region and an n-type semiconductor region insulated from each other in a substrate; forming a first and second gate insulating films on the p-type and n-type semiconductor regions, respectively; forming a first nickel silicide made of one of $NiSi_2$ cubic, NiSi orthorhombic, and $Ni_2Si$ orthorhombic on the first gate insulating film, and a second nickel silicide made of at least one of $Ni_{31}Si_{12}$ hexagonal and $Ni_3Si$ cubic on the second gate insulating film; and diffusing aluminum in the first nickel silicide so as to segregate the aluminum at an interface between the first nickel silicide and the first gate insulating film.

A semiconductor device according to a third aspect of the present invention includes: a substrate; an n-channel MIS transistor including: a p-type semiconductor region formed in the substrate; first source/drain regions formed at a distance from each other in the p-type semiconductor region; a first gate insulating film formed on the p-type semiconductor region between the first source/drain regions; a first gate electrode including a first nickel silicide having a composition of Ni/Si<31/12 formed above the first gate insulating film; and a first aluminum layer segregated at an interface between the first gate insulating film and the first gate electrode; and a p-channel MIS transistor including: an n-type semiconductor region insulated from the p-type semiconductor region and formed in the substrate; second source/drain regions formed at a distance from each other in the n-type semiconductor region; a second gate insulating film formed on the n-type semiconductor region between the second source/drain regions; and a second gate electrode including a second nickel silicide having a composition of Ni/Si<31/12 formed above the second gate insulating film, and a third nickel silicide having a composition of Ni/Si≧31/12 formed above the second nickel silicide.

DESCRIPTION OF THE PREFERRED EMBODIMENTS

Figure 1:
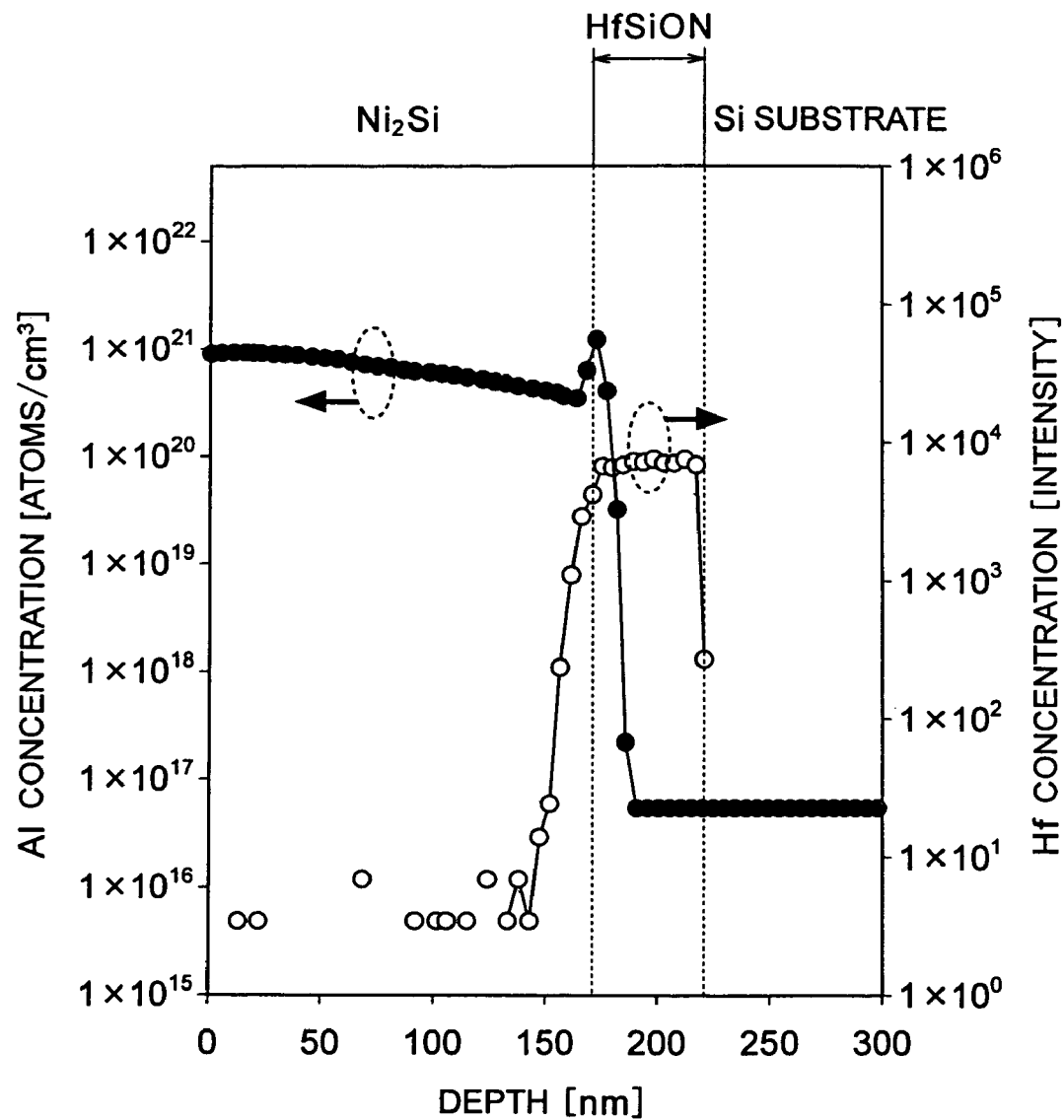
FIG. 1 shows the results of a SIMS experiment conducted to examine the aluminum diffusion behavior in a $Ni_2Si$ film.

The following is a description of embodiments of the present invention, with reference to the accompanying drawings. The accompanying drawings are schematic views designed to facilitate explanation and understanding of the invention. The shapes, sizes, and ratios shown in the drawings might be different from those of the actual devices, but they may be arbitrarily changed or modified, with the following description and the conventional techniques being taken into account.

In each of the following embodiments, MIS transistors or CMIS transistors will be described. However, the present invention may be applied to system LSI and the likes that include logic circuits and some other circuits having MIS transistors integrated thereon.

Before describing the embodiments of the present invention, the course of events for achieving the present invention will be described below.

In an n-channel MIS transistor in accordance with one embodiment of the present invention, an aluminum layer is segregated at the interface between the gate insulating film and the Ni-FUSI (full-silicide gate electrode). With this arrangement, the work function of the Ni-FUSI of the n-channel MIS transistor is approximately 4.3 eV, which is suitable for reducing the threshold value Vth.

Such a structure is also disclosed in a reference (Y. H. Kim et al., "Systematic Study of Workfunction Engineering and Scavenging Effect Using NiSi Alloy FUSI Metal Gates with Advanced Gate Stacks", 2005 IEDM, p.p. 657-660). However, in an embodiment of the present invention, this structure is realized by a different technique. More specifically, in the embodiment of the present invention, after a nickel silicide layer is formed, aluminum is segregated in the interface by causing solid phase diffusion from the aluminum thin film on the nickel silicide film or thermal diffusion after aluminum ion implantation.

This embodiment of the present invention is characterized by the method for manufacturing the above described aluminum segregated structure. The inventors made an intensive study on the aluminum solid-phase diffusion in the nickel silicide layer, to find that the aluminum diffusion phenomenon strongly depends on the composition of the nickel silicide as the parent phase. Utilizing this feature, the Ni-FUSI of the n-channel MIS transistor is designed to have such a composition as to easily cause aluminum diffusion, and at least a part of the Ni-FUSI of the p-channel MIS transistor is designed to have such a composition as not to easily cause aluminum diffusion. An aluminum layer is deposited simultaneously on both transistors, or heat treatment is carried out after collective ion implantation. In this manner, a sufficient amount of aluminum for changing the work function is segregated only at the interface between the Ni-FUSI and the gate insulating film of the n-channel MIS transistor. Thus, the threshold voltage Vth is reduced, which characterizes the manufacturing method in accordance with the embodiment of the present invention.

First, a silicon substrate is covered with a HfSiON film to be the gate insulating film, and the upper portion of the resultant structure is covered with a nickel silicide $Ni_2Si$ film. The upper portion of the resultant structure is further covered with an aluminum thin film, and heat treatment is carried out at 450° C. for 30 minutes. In this manner, a $Ni_2Si$/HfSiON stacked structure is formed. FIG. 1 shows the results of measurement carried out to measure the depth profiles of aluminum and hafnium elements inside the $Ni_2Si$/HfSiON stacked structure. In this experiment, to accurately measure the profile of the aluminum in the interface between the $Ni_2Si$ and the HfSiON and in the $Ni_2Si$, the Si substrate was physically polished and was thinned. Accelerated primary ions or $O^{2+}$ ions in this case were introduced into the substrate, and the element profile evaluation was made while etching was performed on the sample. In other words, an analysis was made by backside SIMS (Secondary Ion Mass Spectrometry). By this analysis method, the profile was measured from the low aluminum concentration side toward the high aluminum concentration side. Accordingly, a deviation from the true element profile due to the element implantation caused deep inside the sample that is characteristic of SIMS is not easily caused, and a more accurate depth profile of aluminum can be obtained. Here, the aluminum layer on the upper portion was removed by a solution process or the like prior to the backface SIMS analysis. Through the heat treatment, solid phase diffusion of a large amount of aluminum was caused from the top aluminum layer into the $Ni_2Si$. The diffusion was blocked when it reached the HfSiON insulating film, and the aluminum was segregated in the interface. As can be seen from FIG. 1, aluminum was hardly diffused in the HfSiON insulating film used in this case. Having amorphous properties, the HfSiON insulating film is considered to have a greater aluminum diffusion preventing effect than a polycrystalline insulating film. In a case where NiSi, instead of $Ni_2Si$, is used as the nickel silicide, the same aluminum diffusion behavior as that in the case of $Ni_2Si$ is observed.

Figure 2:
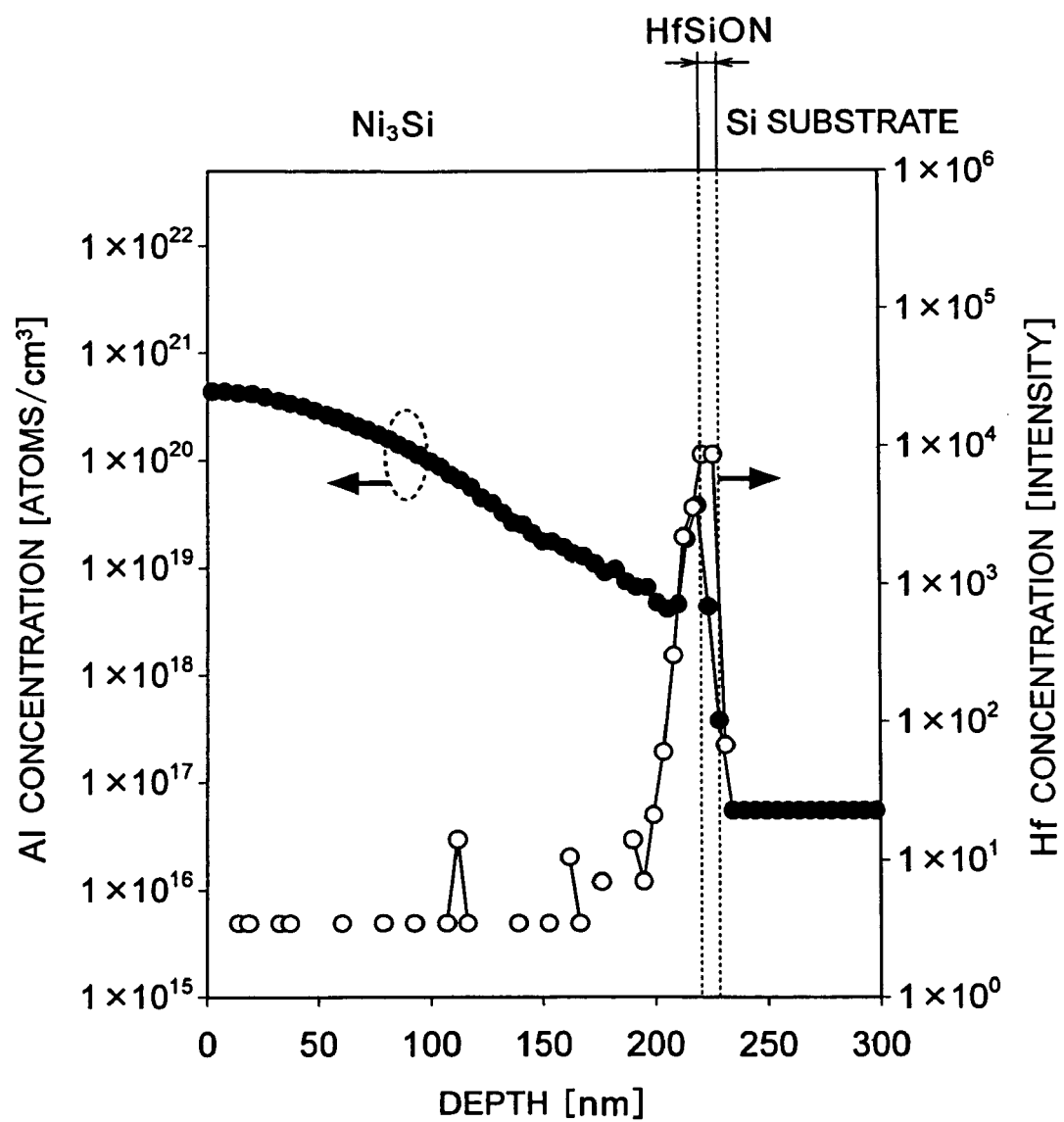
FIG. 2 shows the results of a SIMS experiment conducted to examine the aluminum diffusion behavior in a $Ni_3Si$ film.

FIG. 2 shows the depth profiles of aluminum and hafnium elements in a $Ni_3Si$/HfSiON stacked structure observed in a case where $Ni_3Si$, instead of $Ni_2Si$, was used as the nickel silicide, and the same experiment as that in FIG. 1 was conducted. As in the case of $Ni_2Si$, a large amount of aluminum was diffused from the top aluminum layer into the $Ni_3Si$. However, when compared with the case of $Ni_2Si$ shown in FIG. 1, the decrease in the depth direction of the aluminum profile in the nickel silicide of $Ni_3Si$ was larger in this experiment, and the variation in aluminum concentration at the interface with the HfSiON insulating film was approximately $1/100$ times lower than that in the case of $Ni_2Si$, though the aluminum was deposited and the heat treatment was carried out under exactly the same conditions.

As described above, it was found that the aluminum diffusion in the nickel silicide largely depends on the silicide composition, and diffusion becomes more difficult as the silicide is richer in nickel. Due to the difference in properties, the amount of aluminum piling up in the interface between a nickel-rich silicide and the insulating film is much smaller.

As described above, the inventors of the present invention made clear the influence of the nickel silicide parent phase on the aluminum diffusion through the unique experiment. The above phenomenon is considered to derive from the easiness of alloying between nickel and aluminum. The two metals have stable alloy phases such as $NiAl_3$, $Ni_2Al_3$, NiAl, and $Ni_3Al$. Therefore, when the two elements meet in an active state, a chemical change to those alloy phases is caused. Here, when aluminum ions are implanted or introduced into the nickel silicide by solid phase diffusion from a thin film, the Ni—Al alloying reaction is easier as the amount of nickel in the nickel silicide as the parent phase is larger. In a nickel-rich silicide phase such as $Ni_3Si$ orthorhombic or $Ni_{31}Si_{12}$ cubic, or in a nickel silicide film having such a composition that the composition ratio of Ni to Si (=Ni/Si) is 31/12 or higher, the diffused aluminum element easily reacts with Ni, and the diffusion distance becomes shorter accordingly. On the other hand, in a silicide phase such as $NiSi_2$ cubic, NiSi orthorhombic, or $Ni_2Si$ orthorhombic, or in a nickel silicide film having such a composition that the composition ratio Ni/Si is lower than 31/12, the diffused aluminum element does not easily react with Ni, and the aluminum diffusion coefficient is larger than the above described Ni-rich silicide.

Figure 3:
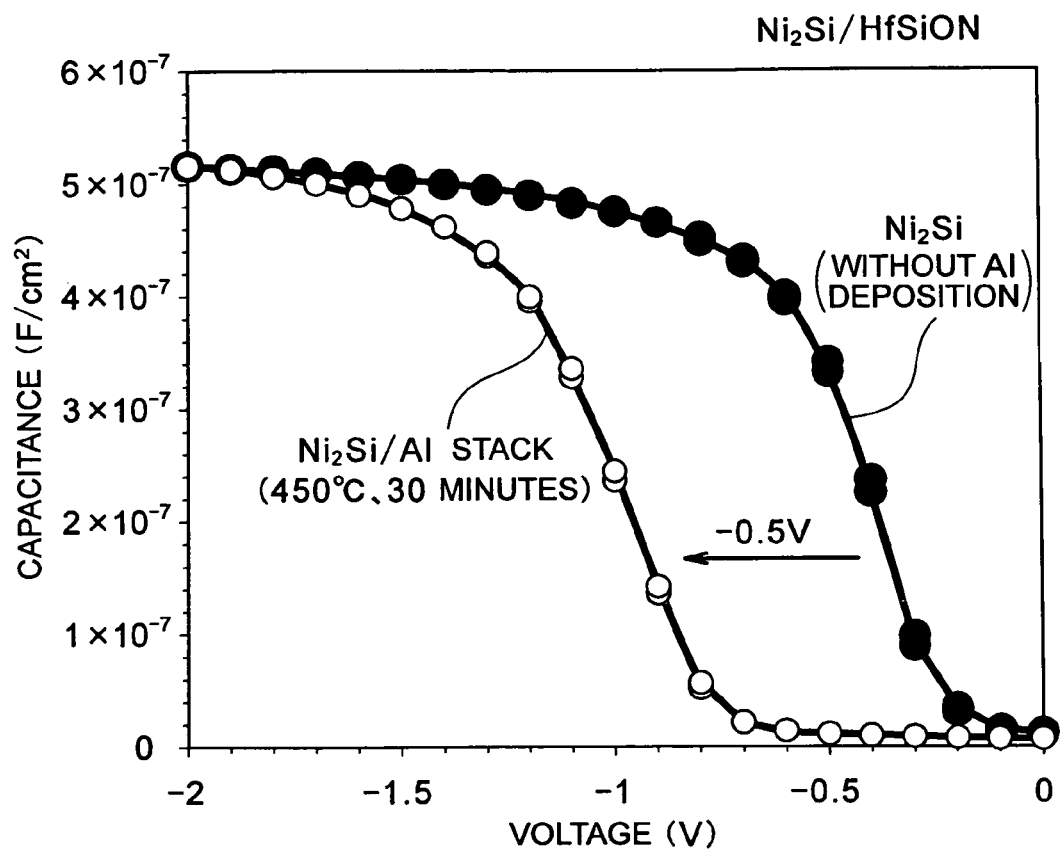
FIG. 3 shows the capacitance-voltage characteristics of a $Ni_2Si$/HfSiON/p-type Si capacitor.

FIG. 3 is a graph showing the comparison between the C-V (capacitance-voltage) characteristics of a MIS capacitor formed with a stacked structure of $Ni_2Si$/HfSiON/p-type Si and the C-V characteristics of a MIS capacitor formed by depositing aluminum on the $Ni_2Si$ of the other MIS capacitor and carrying out heat treatment at 450° C. for 30 minutes. Compared with the flat band voltage of the former capacitor, the flat band voltage of the latter MIS capacitor is shifted by −0.5 V. This is considered to be caused by the aluminum atoms segregated in the interface observed in FIG. 1.

Figure 4:
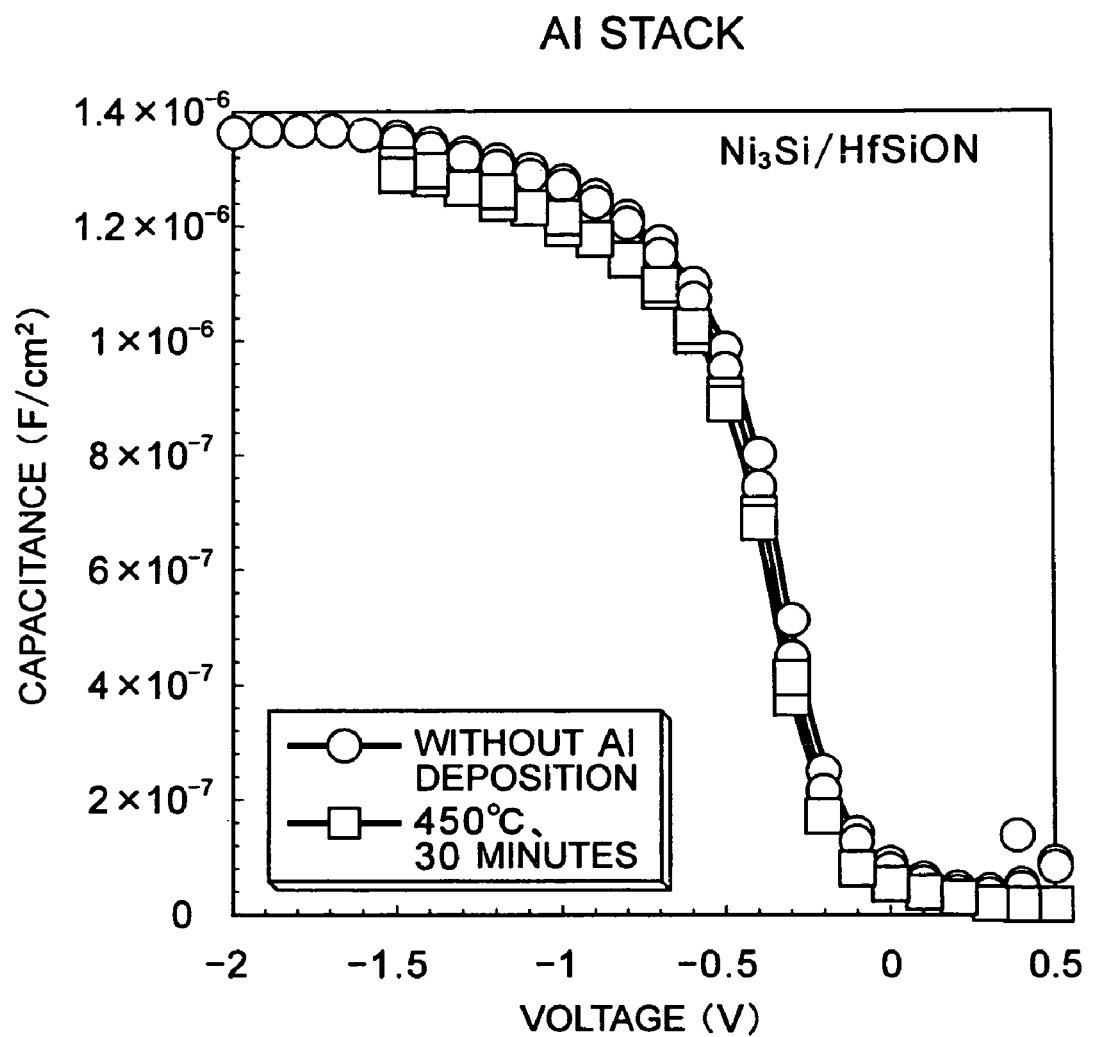
FIG. 4 shows the capacitance-voltage characteristics of a $Ni_3Si$/HfSiON/p-type Si capacitor.
Figure 5:
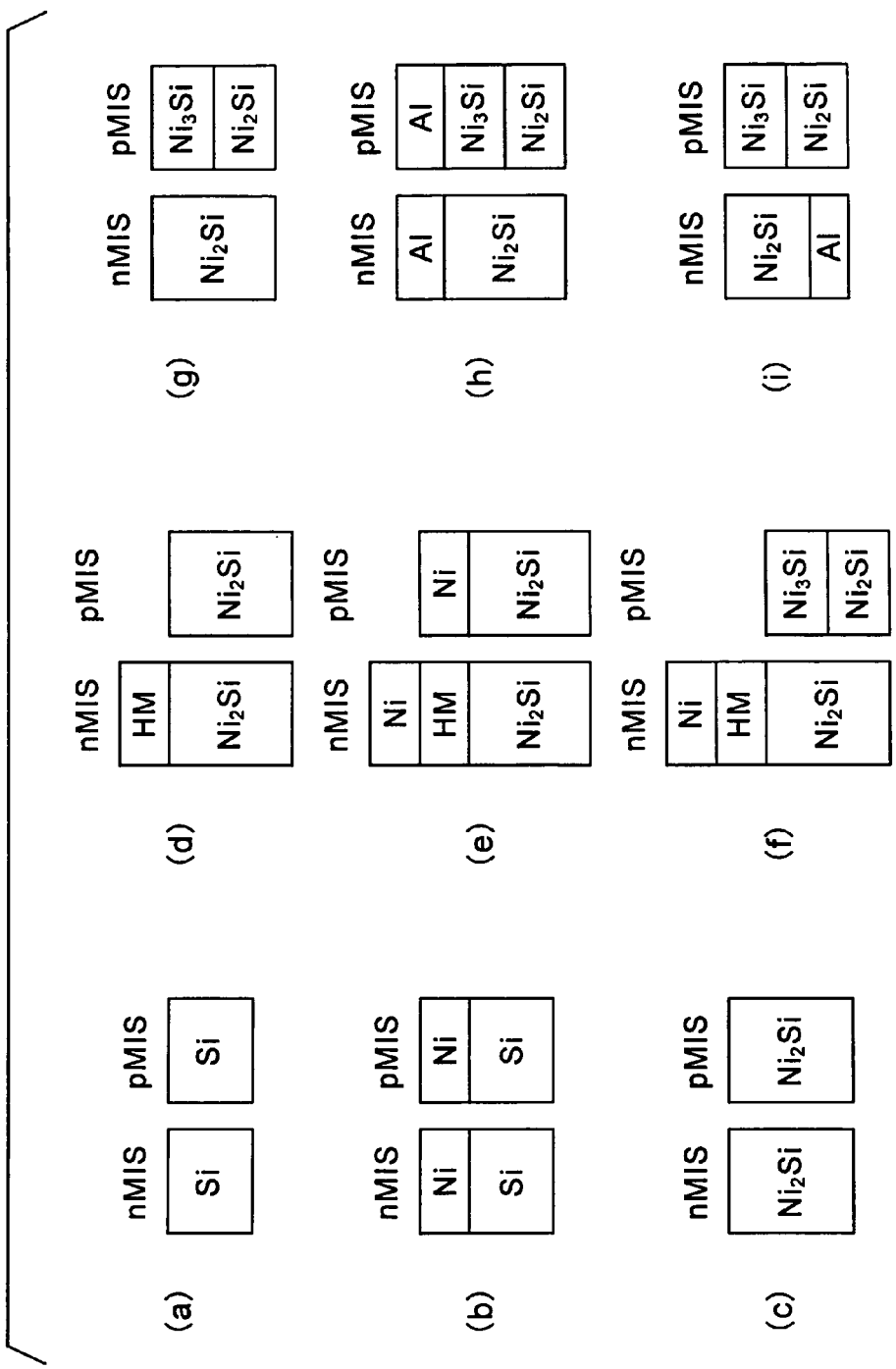
FIGS. 5(a) through 5(i) are schematic views illustrating the procedures for forming a nickel silicide gate electrode by a manufacturing method according to one embodiment.
Figure 6:
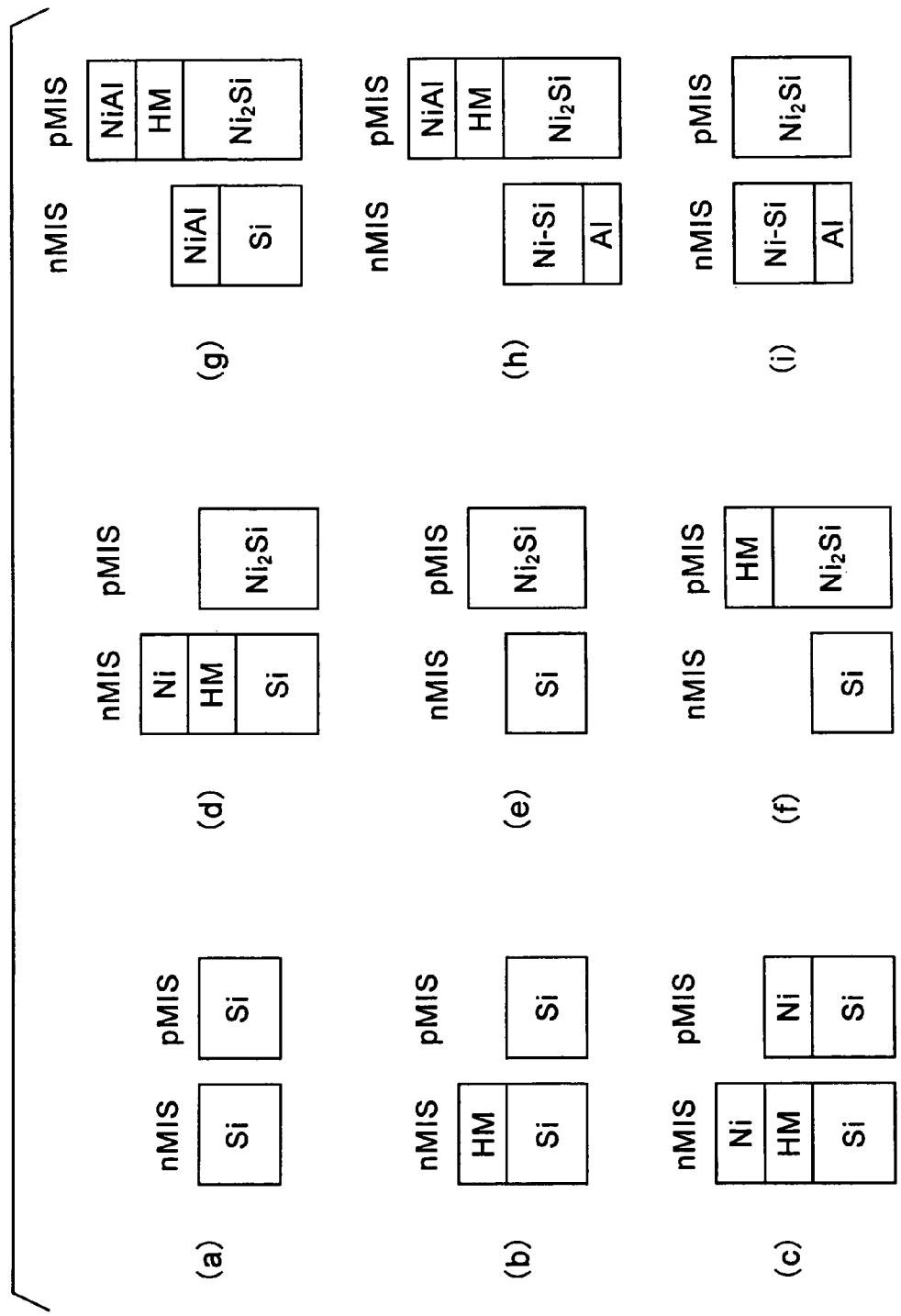
FIGS. 6(a) through 6(i) are schematic views illustrating the procedures for forming a nickel silicide gate electrode by a conventional manufacturing method.
Figure 7:
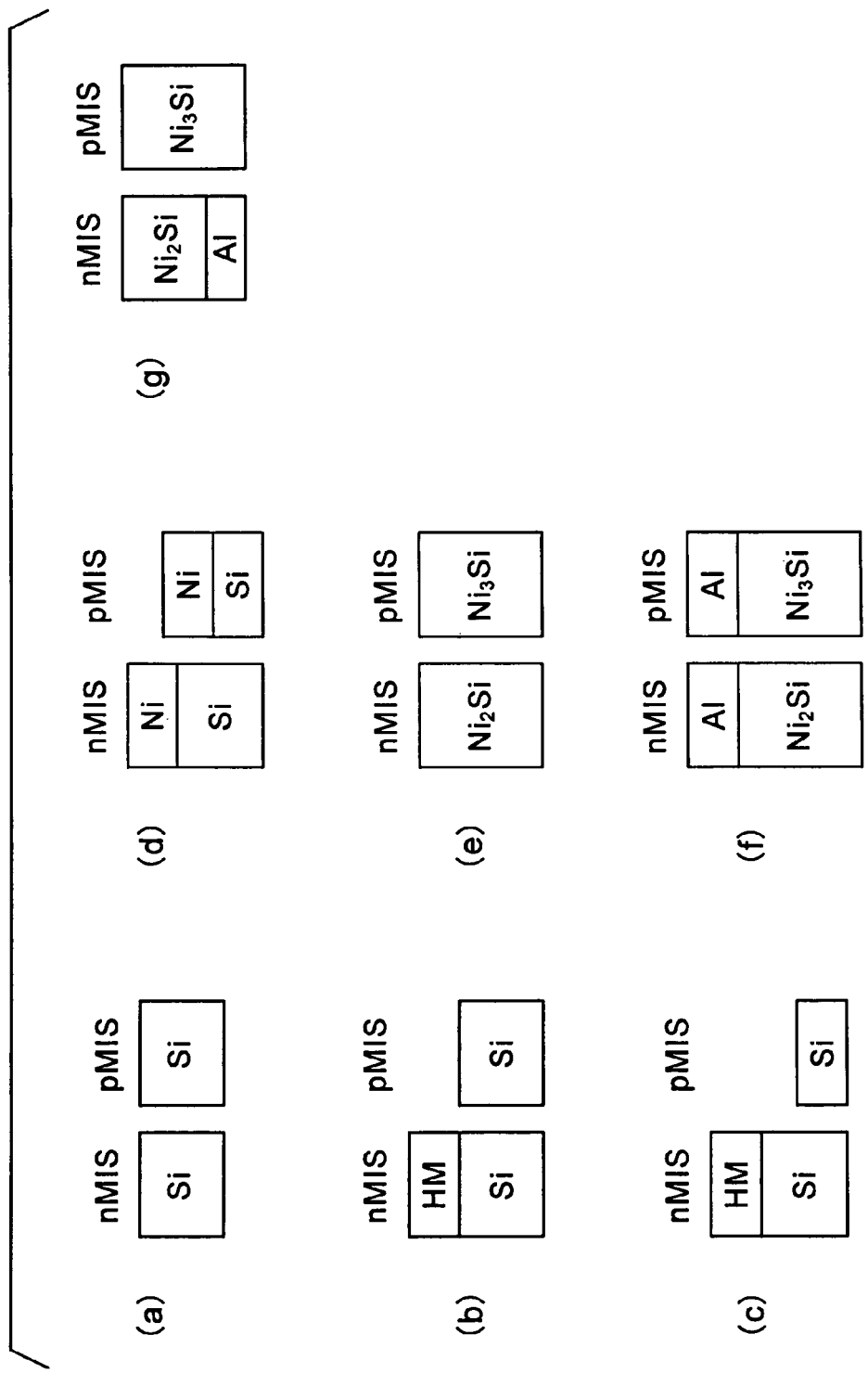
FIGS. 7(a) through 7(g) are schematic views illustrating the procedures for forming a nickel silicide gate electrode according to one embodiment.

FIG. 4 is a graph showing the comparison between the C-V (capacitance-voltage) characteristics of a MIS capacitor formed with a stacked structure of $Ni_3Si$/HfSiON/p-type Si and the C-V characteristics of a MIS capacitor formed by depositing aluminum on the $Ni_3Si$ of the other MIS capacitor and carrying out heat treatment at 450° C. for 30 minutes. The C-V characteristics of the former MIS capacitor are substantially the same as the C-V characteristics of the latter MIS capacitor. As can be confirmed in FIG. 2, the amount of aluminum segregated in the interface in the case of $Ni_3Si$ is smaller than that in the case of $Ni_2Si$. Therefore, it is considered that a substantial change in flat band voltage was not caused by the heat treatment at 450° C. for 30 minutes.

As can be seen from the C-V characteristics of the MIS capacitor formed by carrying out the heat treatment at 450° C. for 30 minutes after the deposition of aluminum, the work function in the case of $Ni_2Si$ is approximately 4.3 eV, and the work function in the case of $Ni_3Si$ is approximately 4.8 eV. Those values are work function values effective for reducing the threshold voltage Vth of each CMIS.

As described above through the experiment results, the amount of aluminum segregated at the interface can be controlled by changing the nickel silicide compositions. In one embodiment of the present invention, a nickel silicide having such a composition that aluminum can be relatively easily diffused and implanted in the nickel silicide, such as $Ni_2Si$, NiSi, or $NiSi_2$, is provided in the n-channel MIS transistor, and a nickel silicide having such a composition that aluminum cannot be easily diffused and implanted in the nickel silicide, such as $Ni_3Si$ or $Ni_{31}Si_{12}$, is provided at least on the top layer of the silicide gate electrode in the p-channel MIS transistor. An aluminum thin film layer is then formed simultaneously on the two silicides, or aluminum ions are implanted simultaneously in the surface layers of the two silicides. After that, heat treatment under the optimum conditions is carried out. By doing so, the work function becomes as low as 4.3 eV by virtue of the aluminum segregated in the interface between the nickel silicide such as $Ni_2Si$ and the gate insulating film, and the threshold voltage Vth can be easily lowered in the n-channel MIS transistor. In the p-channel MIS transistor, on the other hand, a large amount of aluminum is not segregated at the interface between the silicide and the gate insulating film, and therefore, the work function of the silicide in the region in contact with the gate insulating film can be used as it is. Thus, the threshold voltage Vth can be easily lowered.

As a result of a comparison between the method in accordance with the above embodiment of the present invention and the method disclosed in the reference (Y. H. Kim et al., "Systematic Study of Workfunction Engineering and Scavenging Effect Using NiSi Alloy FUSI Metal Gates with Advanced Gate Stacks", 2005 IEDM, p.p. 657-660), the following two advantages are found in the method of the present invention.

The first advantage of the embodiment of the present invention lies in the fact that the two procedures of the nickel silicide forming reaction and the aluminum segregation are independent of each other. Accordingly, the respective procedures can be optimized independently of each other, and the process margin can be widened.

By the conventional method disclosed in the reference (Y. H. Kim et al., "Systematic Study of Workfunction Engineering and Scavenging Effect Using NiSi Alloy FUSI Metal Gates with Advanced Gate Stacks", 2005 IEDM, p.p. 657-660), the nickel silicide forming reaction and the aluminum segregation need to be collectively performed in one heat treatment procedure, and cannot be separated from each other.

Therefore, to segregate an appropriate amount of aluminum, an excessive nickel silicide reaction is caused, or the uniformity of the silicidation in the wafer plane is lost. Also, when the nickel silicide reaction is optimized, a desired low threshold voltage Vth may not be obtained due to the insufficient aluminum segregation, or a statistical variation of the threshold voltage Vth may be caused.

By the method in accordance with the embodiment of the present invention, on the other hand, the nickel silicide forming reaction and the aluminum segregation are performed in separate procedures. The aluminum diffusing procedure may be carried out so as to segregate the requisite amount of aluminum at the interface between the nickel silicide and the gate insulating film, after the nickel silicide is formed by heat treatment carried out at the optimum temperature for the optimum period of time so as not to cause transistor size dependency.

The second advantage of the method of the present invention is simplified manufacturing procedures. By the method in accordance with the one embodiment of the present invention, a Ni-FUSI having such a composition that aluminum can be easily diffused and implanted therein needs to be formed in the n-channel MIS transistor (hereinafter referred to also as the nMIS), and a Ni-FUSI having such a composition that aluminum is not easily diffused and implanted at least in one part needs to be formed in the p-channel MIS transistor (hereinafter referred to also as the pMIS). FIGS. 5(a) through 5(i) show the essential points (only the gate electrode portions) in the manufacturing procedures. First, gate insulating films (not shown) are formed on a semiconductor substrate (not shown) on which the nMIS and the pMIS are to be formed. Polycrystalline silicon layers to be the gate electrodes are then formed on the gate insulating films (FIG. 5(a)). Ni layers are then formed on the polycrystalline silicon layers (FIG. 5(b)). Heat treatment is carried out to cause a solid phase reaction between the Ni layers and the polycrystalline layers, and the Ni layers and the polycrystalline layers are turned into $Ni_2Si$ layers (FIG. 5(c)). A hard mask HM is formed only on the $Ni_2Si$ layer of the nMIS (FIG. 5(d)). After that, a Ni layer is formed on the entire surface (FIG. 5(e)). Heat treatment is then carried out to turn the upper layer of the $Ni_2Si$ layer of the pMIS into a Ni-rich $Ni_3Si$ layer (FIG. 5(f)). Here, the $Ni_2Si$ layer of the nMIS is not changed by virtue of the existence of the hard mask HM. The hard mask HM and the Ni layer of the nMIS are then removed (FIG. 5(g)), and an aluminum layer is deposited on the entire surface (FIG. 5(h)). Heat treatment is then carried out to segregate the Al at the interface between the $Ni_2Si$ layer and the gate insulating film of the nMIS (FIG. 5(i)). By this method, the one-time hard mask process (FIG. 5(d)) needs to be carried out to prepare the different Ni-FUSI compositions. However, the aluminum diffusion is caused in a self-aligning manner by utilizing the difference in aluminum diffusion behavior between the nickel silicide compositions. Accordingly, the hard mask process does not need to be carried out.

FIGS. 6(a) through 6(i) show the essential points of a method for manufacturing CMISs according to the reference (Y. H. Kim et al., "Systematic Study of Workfunction Engineering and Scavenging Effect Using NiSi Alloy FUSI Metal Gates with Advanced Gate Stacks", 2005 IEDM, p.p. 657-660). First, gate insulating films (not shown) are formed on a semiconductor substrate (not shown) on which the nMIS and the pMIS are to be formed. Polycrystalline silicon layers to be the gate electrodes are then formed on the gate insulating films (FIG. 6(a)). A hard mask HM is then formed only on the polycrystalline silicon layer of the nMIS (FIG. 6(b)). After that, an Ni layer is formed on the entire surface (FIG. 6(c)), and heat treatment is carried out to turn the Ni layer on the pMIS into a $Ni_2Si$ layer (FIG. 6(d)). After the hard mask HM and the Ni layer on the nMIS are removed (FIG. 6(e)), a hard mask HM is formed only on the $Ni_2Si$ layer of the pMIS (FIG. 6(f)). A Ni—Al layer is then deposited on the entire surface, and heat treatment is carried out to turn the polycrystalline silicon layer of the nMIS into a nickel silicide (FIG. 6(g)) and segregate the Al in the interface between the nickel silicide and the gate insulating film of the nMIS (FIG. 6(h)). The hard mask HM and the Ni—Al layer on the $Ni_2Si$ layer of the pMIS are removed (FIG. 6(i)). As can be seen from FIGS. 6(a) through 6(i), the method for manufacturing CMISs according to the reference (Y. H. Kim et al., "Systematic Study of Workfunction Engineering and Scavenging Effect Using NiSi Alloy FUSI Metal Gates with Advanced Gate Stacks", 2005 IEDM, p.p. 657-660) requires the two hard mask processes: the hard mask process for forming a Ni-FUSI composition suitable for the p-channel MIS transistor; and the hard mask process for forming a Ni—Al layer only on the n-channel MIS transistor. The hard mask processes including the lithography procedures increase the number of manufacturing procedures, which is undesirable.

In another embodiment of the present invention, a conventional Ni-FUSI composition modulating technique may be used. FIGS. 7(a) through 7(g) show the essential points in a manufacturing method involving etchback of the Si layer of the p-channel MIS transistor. First, gate insulating films (not shown) are formed on a semiconductor substrate (not shown) on which the nMIS and the pMIS are to be formed. Polycrystalline silicon layers or the like to be the gate electrodes are then formed on the gate insulating films (FIG. 7(a)). A hard mask HM is then formed only on the polycrystalline silicon layer of the nMIS (FIG. 7(b)). Etchback is then performed only on the polycrystalline silicon layer on the pMIS (FIG. 7(c)). A Ni layer is then formed on the entire surface (FIG. 7(d)), and heat treatment is carried out to turn the polycrystalline silicon layer of the nMIS into a $Ni_2Si$ layer and turn the polycrystalline silicon layer of the pMIS into a $Ni_3Si$ layer (FIG. 7(e)). An Al layer is then formed on the entire surface (FIG. 7(f)), and heat treatment is carried out to segregate the Al at the interface between the $Ni_2Si$ layer and the gate insulating film of the nMIS (FIG. 7(g)). In this case, the number of hard mask processes is reduced from two to one, compared with the case of the method according to the reference (Y. H. Kim et al., "Systematic Study of Workfunction Engineering and Scavenging Effect Using NiSi Alloy FUSI Metal Gates with Advanced Gate Stacks", 2005 IEDM, p.p. 657-660). Accordingly, the manufacturing procedures are simplified. Furthermore, the Ni silicidation process and the aluminum diffusion process can be controlled independently of each other. Thus, a greater degree of freedom is allowed in the process design.

First Embodiment

Figure 8:
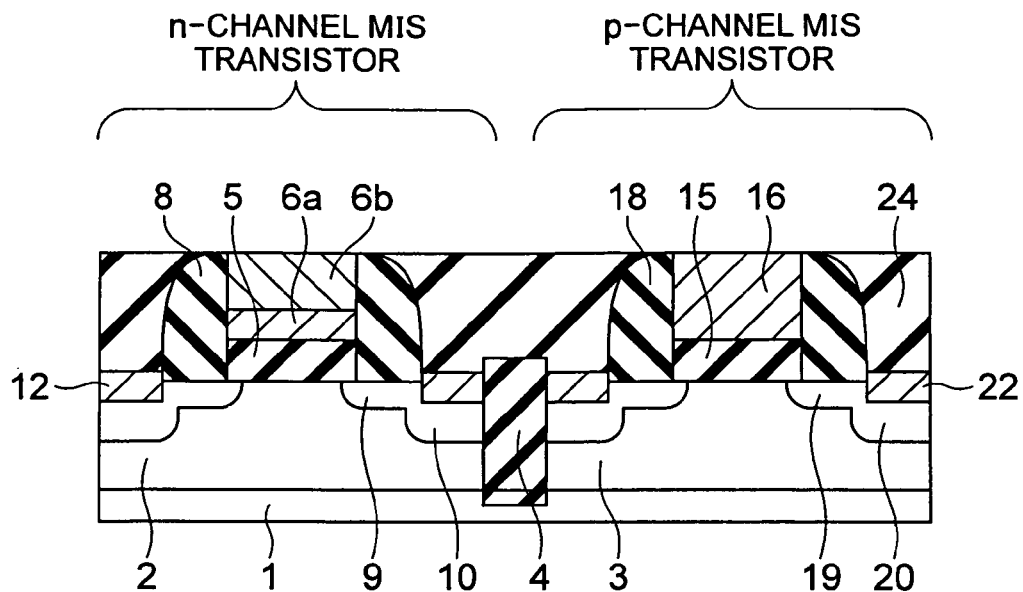
FIG. 8 is a cross-sectional view of a CMISFET according to a first embodiment.

Next, a semiconductor device in accordance with a first embodiment of the present invention is described. The semiconductor device of this embodiment is a CMISFET. FIG. 8 shows a cross-sectional view of the semiconductor device, taken along a line extending in the gate length direction.

As shown in FIG. 8, a p-type well region 2 and an n-type well region 3 are formed in a silicon substrate 1. The well regions 2 and 3 are electrically insulated from each other by a device isolating layer 4 made of $SiO_2$ or the like. An n-channel MIS transistor is formed in the p-type well region 2, and a p-type channel MIS transistor is formed in the n-type well region 3.

The n-channel MIS transistor includes: a gate insulating film 5 that is formed on the p-type well region 2; a gate electrode 6 that is formed on the gate insulating film 5; gate sidewalls 8 that are formed with insulators formed on the side portions of the gate electrode 6; n-type extension layers 9 that are formed at the portions of the p-type well region 2 located on both sides of the gate electrode 6; n-type diffusion layers 10 that are formed at the portions of the p-type well region 2 located on both sides of the gate sidewalls 8; and Ni silicide layers 12 that are formed on the n-type diffusion layers 10 and are made of NiSi. The gate electrode 6 has a stacked structure of an aluminum layer 6a formed on the gate insulating film 5 and a silicide layer 6b formed on the aluminum layer 6a. The n-type diffusion layers 10 are designed to have a deeper junction depth with the p-type well region 2 than the n-type extension layers 9, and the n-type diffusion layers 10 and the n-type extension layers 9 serve as the source/drain regions of the n-channel MIS transistor. Here, the source/drain regions may be a region of a semiconductor doped at high concentration, or may be a region of a metal silicide. There may be impurity elements segregated in the metal silicide and its junction plane.

The p-channel MIS transistor includes: a gate insulating film 15 that is formed on the n-type well region 3; a gate electrode 16 that is formed on the gate insulating film 15 and is made of silicide; gate sidewalls 18 that are formed with insulators formed on the side portions of the gate electrode 16; p-type extension layers 19 that are formed at the portions of the n-type well region 3 located on both sides of the gate electrode 16; p-type diffusion layers 20 that are formed at the portions of the n-type well region 3 located on both sides of the gate sidewalls 18; and Ni silicide layers 22 that are formed on the p-type diffusion layers 20 and are made of NiSi. The p-type diffusion layers 20 are designed to have a deeper junction depth with the n-type well region 3 than the p-type extension layers 19, and the p-type diffusion layers 20 and the p-type extension layers 19 serve as the source/drain regions of the p-type MIS transistor. The n-channel MIS transistor and the p-channel MIS transistor are covered with an interlayer insulating film 24.

The film thickness of the aluminum layer 6a of the gate electrode 6 is 1 monolayer or greater. In such a case, the threshold voltage Vth of the MIS transistor is determined by the work function of aluminum, not by the work function of nickel silicide. The silicide layer 6b of the gate electrode 6 is made of $Ni_2Si$, NiSi, $NiSi_2$, or the like. The gate electrode 16 is made of $Ni_3Si$, $Ni_{31}Si_{12}$, or the like. In FIG. 8, the entire gate electrode 16 is $Ni_3Si$. However, aluminum diffusion can be restrained, as long as the uppermost portion of the gate electrode 16 is a layer of the crystalline phase of $Ni_3Si$.

(Manufacturing Method)

Referring now to FIGS. 9 through 15, a method for manufacturing the semiconductor device of this embodiment is described.

Figure 9:
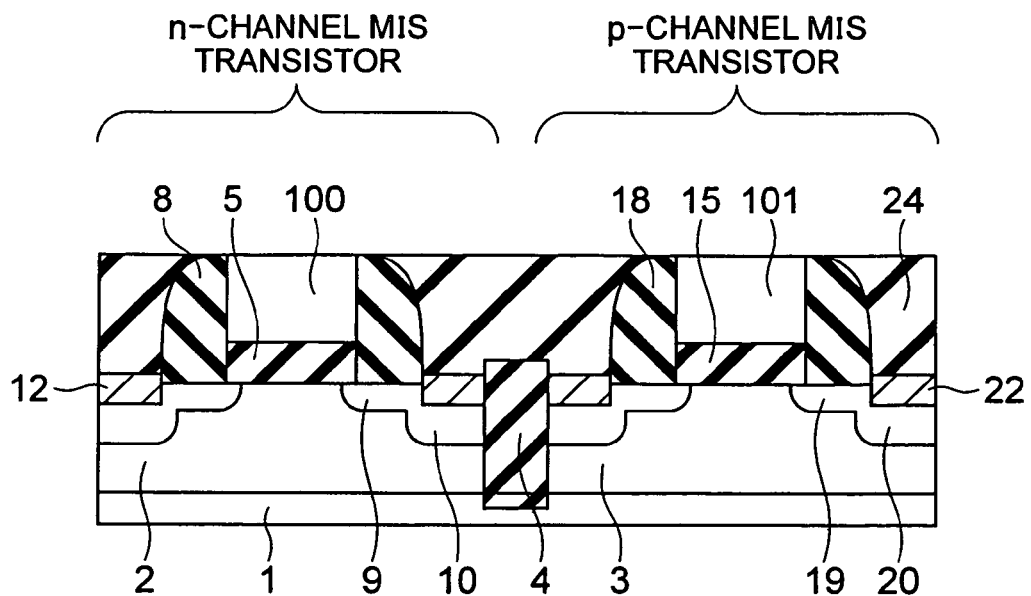
FIGS. 9 through 12 are cross-sectional views illustrating the procedures for manufacturing the CMISFET according to the first embodiment.

First, as shown in FIG. 9, after the device isolating layer 4 is formed in the silicon substrate 1, the p-type well region 2 and the n-type well region 3 are formed through ion implantation. The device isolating layer 4 may be formed by the local oxidation method or STI (shallow trench isolation), and may be of a mesa type.

HfSiON films 5 and 15 as the gate insulating film are formed on the surface of the silicon substrate 1 by MOCVD (metal organic chemical vapor deposition). In a case where insulating films made of a high-permittivity material, some other film forming method such as ALD (atomic layer deposition) may be utilized, instead of MOCVD. Other than the silicon oxide films made of HfSiON, the gate insulating films 5 and 15 may be made of a high-permittivity material, such as SiON, $Si_3N_4$, $Al_2O_3$, $Ta_2O_5$, $TiO_2$, $La_2O_3$, $CeO_2$, $ZrO_2$, $HfO_2$, $SrTiO_3$, or $Pr_2O_3$. However, it is possible to use a silicate that is formed by mixing metal ions with silicon oxide, or a material formed by combining those materials such as LaAl oxide. In any way, it is essential to use a material having the heat resistance required in a transistor of each generation and in the procedures for manufacturing the transistor.

To optimize the effects of this embodiment of the present invention, the absolute value of the energy for forming those gate insulating films should be greater than that of an aluminum oxide. If the gate insulating films satisfy that requirement, the probability of progress of the reduction reaction due to the aluminum segregated at the interface in the later procedures becomes much lower, and degradation of the device characteristics, such as gate leakage current due to the reduction reaction, is not often caused. As a result, the work function of aluminum can be more effectively achieved. In view of this, a high-permittivity material containing Hf, Zr, Ti, or La is more preferable than an insulating material containing Si or Ta.

Examples of the most preferred materials include HfSiON, HfSiO, HfAlON, HfAlO, HfON, LaAlO, or LaHfO, which maintain an amorphous state throughout the LSI manufacturing process. Those materials are preferred, because they can prevent aluminum from easily permeating the gate insulating film when aluminum is segregated at the interface with nickel silicide in a later procedure. Permeation of aluminum in the gate insulating film leads to performance deterioration such as an increase in leakage current in the gate insulating film and a decrease in long-term reliability.

After that, by low-pressure CVD, a 50-nm thick polycrystalline silicon layer to be used as the gate electrode is formed, and a SiN cap layer (not shown) of 50 nm in film thickness is deposited on the polycrystalline silicon layer. Patterning is then performed by a lithography technique, and anisotropic etching is performed to shape the gate electrodes. In this manner, polycrystalline silicon layers 100 and 101 are formed. After that, phosphorus and boron ions are implanted to form the shallower extension layers 9 and 19 with high impurity concentration in the n-type and p-type MIS transistors. The formation of the extension layers 9 and 19 is carried out by the selective epitaxial growth technique. The extension layers 9 and 19 may have elevated source/drain structures that can restrain a short channel effect. Alternatively, it is possible to inject impurities at the time of the formation of the elevated source/drain structures.

The sidewalls 8 and 18 for insulating the gate electrodes from the source/drain regions are formed. Phosphorus and boron ions are then injected at a higher accelerating voltage than that used for forming the extension layers 9 and 19. Heat treatment is carried out at a high temperature, so as to form the deeper diffusion layers 10 and 20. After that, a Ni film of 8 nm is formed by a sputtering technique, and is subjected to heat treatment at 400° C. In this manner, the NiSi contact layers 12 and 22 are formed on the source/drain regions 10 and 20. The unreacted Ni in the other regions is removed by selective etching using a $H_2SO_4$ solution, so as to form NiSi layers only on the source/drain regions 10 and 20. Through this series of procedures, impurity elements such as phosphorus or boron are not introduced into the polycrystalline silicon layers 100 and 101 by virtue of the SiN cap layer provided thereon. This is essential in securing the reaction uniformity when a nickel silicide reaction is caused in a later procedure.

The cap layer made of SiN on the gate electrodes is then removed, and a silicon oxide film to be the interlayer insulating film 24 is deposited by low-pressure CVD. The upper ends of the gate electrodes are then exposed by CMP (chemical mechanical planarization), so as to obtain the structure shown in FIG. 9.

Figure 10:
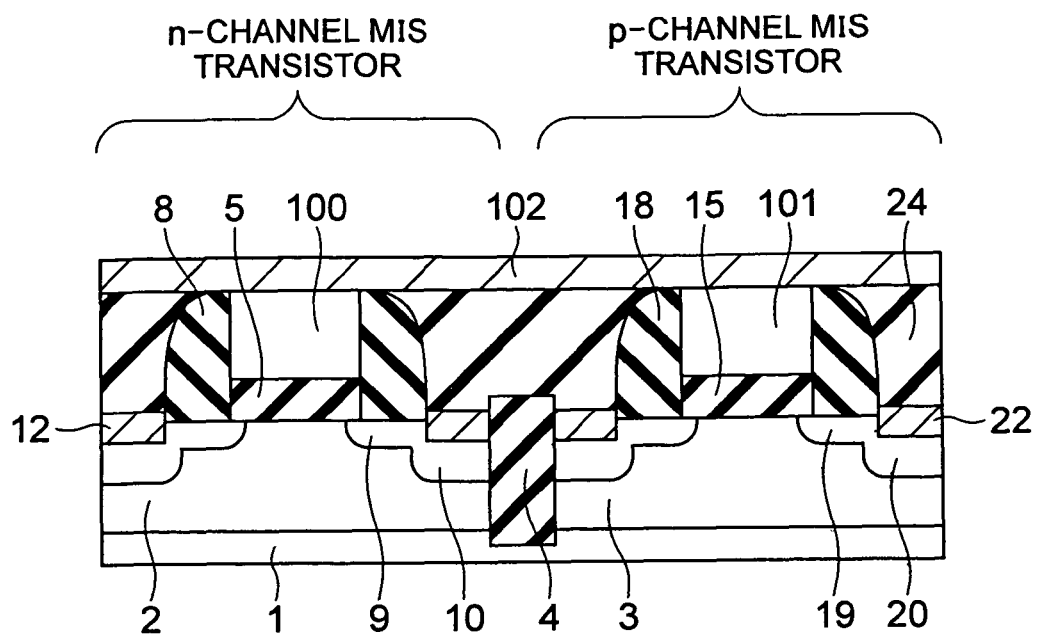
Figure 11:
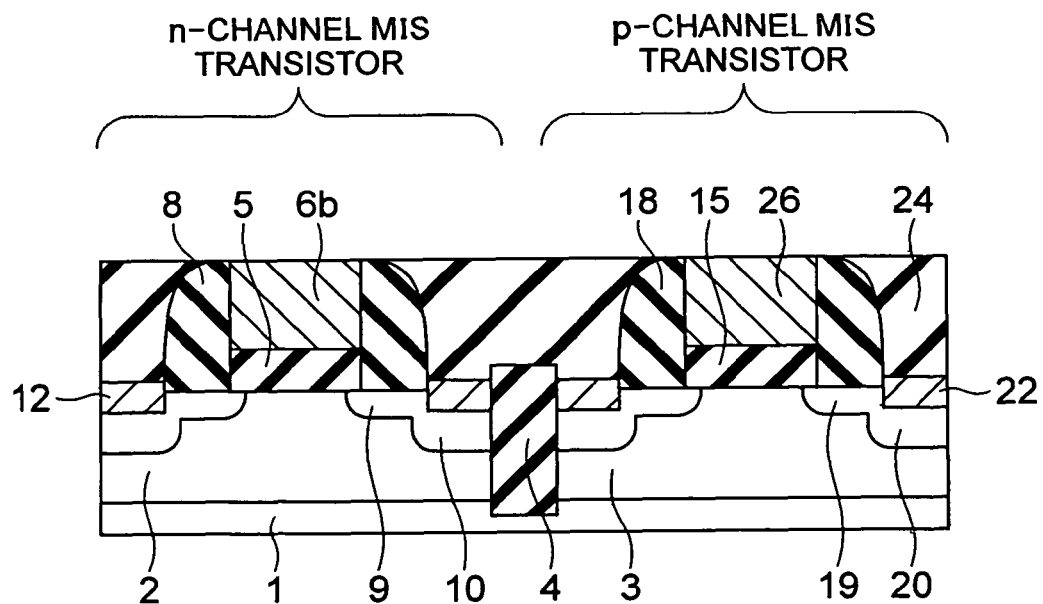

Next, as shown in FIG. 10, a 50-nm thick nickel layer 102 is formed by a sputtering technique or the like. After that, low-temperature heat treatment is carried out at 500° C., so as to form silicide in the interface region between the nickel layer 102 and the silicon layers 100 and 101. Accordingly, the $Ni_2Si$-phase gate electrodes 6b and 26 of the same film thickness are formed in the transistors of both conductivity types (see FIG. 11). Here, if the Ni—Si quantitative ratio is controlled by reducing the film thickness of the Ni to approximately 30 nm, a NiSi crystalline phase can be formed. The specific resistance of the NiSi crystalline phase is approximately 10 μΩcm, which is lower than the specific resistance of 24 μΩcm of a $Ni_2Si$ crystalline phase. Accordingly, the parasitic resistance of the gate can be lowered, and the transistor operating speed can be increased.

Here, it is preferable that the heat treatment for forming the silicide is divided into two stages, and a wet etching procedure for removing the unreacted Ni is carried out between the two stages. By doing so, the excess Ni existing on the gate sidewalls and the likes can be prevented from flowing into the gate electrodes, and the same Ni—Si silicide can be simultaneously formed in the transistors having different gate lengths. As a result, the variation in threshold voltage can be narrowed. In such a case, the first-stage heat treatment should preferably be carried out at a temperature between 300° C. and 450° C. for one minute. If heat treatment is carried out at 500° C. or higher, the excess Ni flows into the gate electrodes as described above. The second-stage heat treatment needs to be carried out at a temperature between 400° C. and 600° C. If heat treatment is carried out at a higher temperature than 600° C., the gate electrodes are broken as the Ni silicide films are aggregated. As a result, the electric resistance of the gate electrodes becomes higher, and inadvertent transistor operations might be caused.

Figures 12, 13:
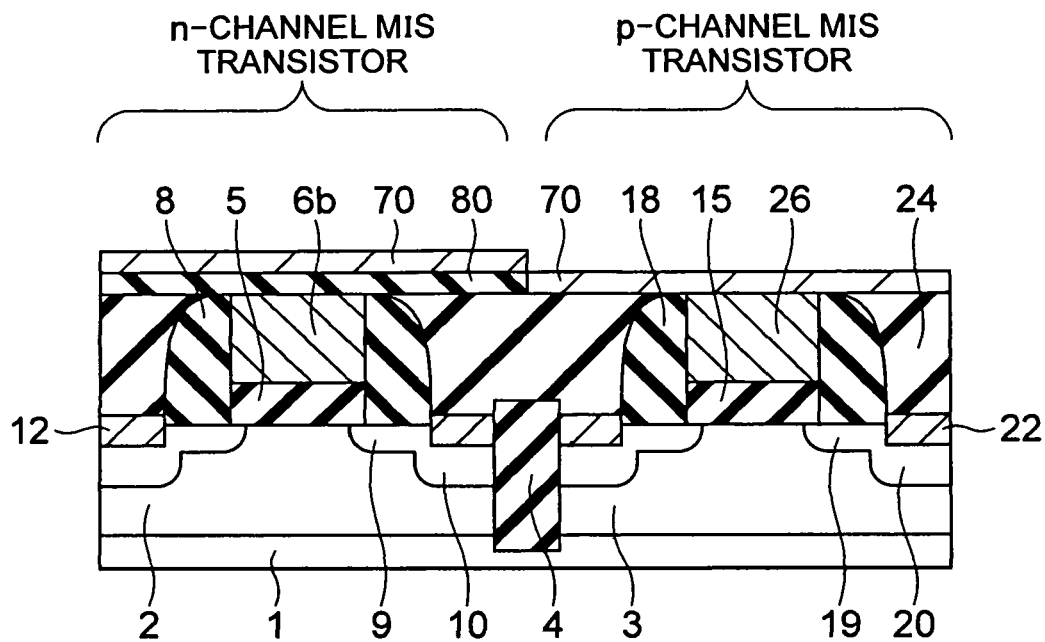
FIG. 13 shows the oxide formation energy of each metal element used in the first embodiment.

Next, as shown in FIG. 12, a hard mask layer 80 made of SiN or the like is formed only on the upper region of the n-channel MIS transistor by a conventional lithography technique, and a nickel layer 70 of 60 nm in film thickness is formed on the hard mask layer 80 by a sputtering technique.

Figure 26:
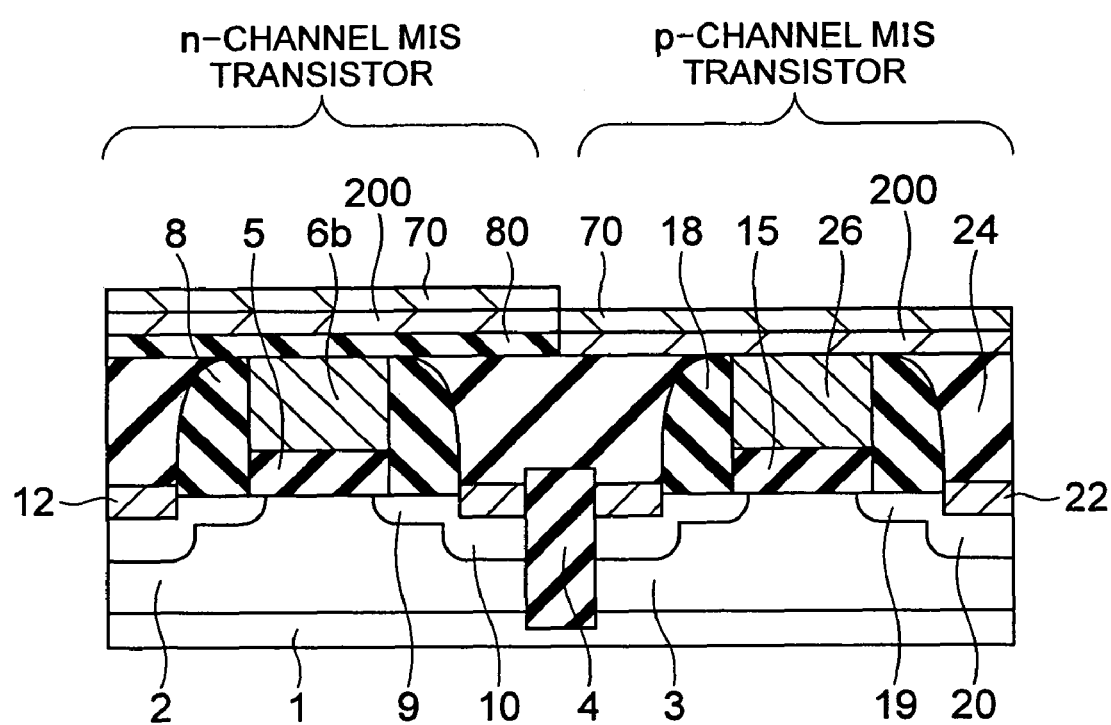
FIG. 26 is a cross-sectional view illustrating the procedure for manufacturing the CMISFET according to a modification of the first embodiment.

Here, as shown in FIG. 26, a metal thin film 200 that is made of titanium, zirconium, or hafnium, and has a thickness of 5 nm to 10 nm may be formed below the nickel layer 70. Those metals have a larger absolute value of the oxide formation energy than Si. Accordingly, with any of those metals, an oxide of the nickel or the silicon of the surface of the $Ni_2Si$ layer can be easily reduced (see FIG. 13). In this manner, a solid phase reaction between nickel and nickel silicide can be promptly caused in a later procedure.

The structure shown in FIG. 12 is then subjected to heat treatment at 500° C. for one minute. By doing so, the nickel silicide 26 ($Ni_2Si$ in this embodiment) forming the gate electrode of the p-channel MIS transistor goes through a phase transition to the silicide 16 ($Ni_3Si$ in this embodiment) that is richer in nickel. After that, the unreacted Ni layer is removed, and the hard mask 80 is removed, to obtain the structure shown in FIG. 14.

Figure 14:
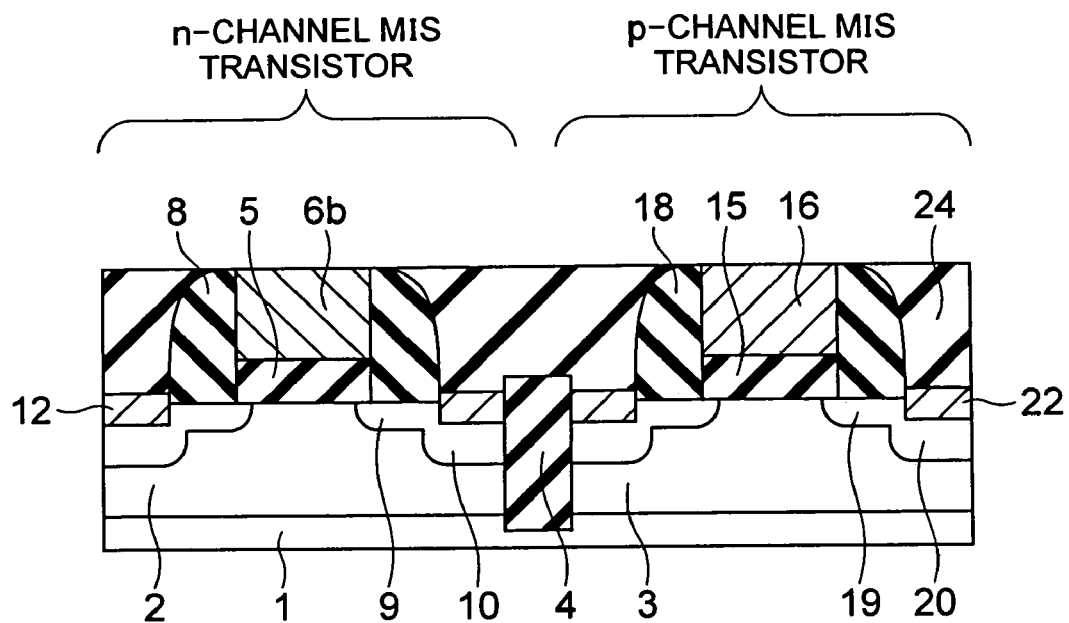
FIGS. 14 and 15 are cross-sectional views illustrating the procedures for manufacturing the CMISFET according to the first embodiment.
Figure 15:
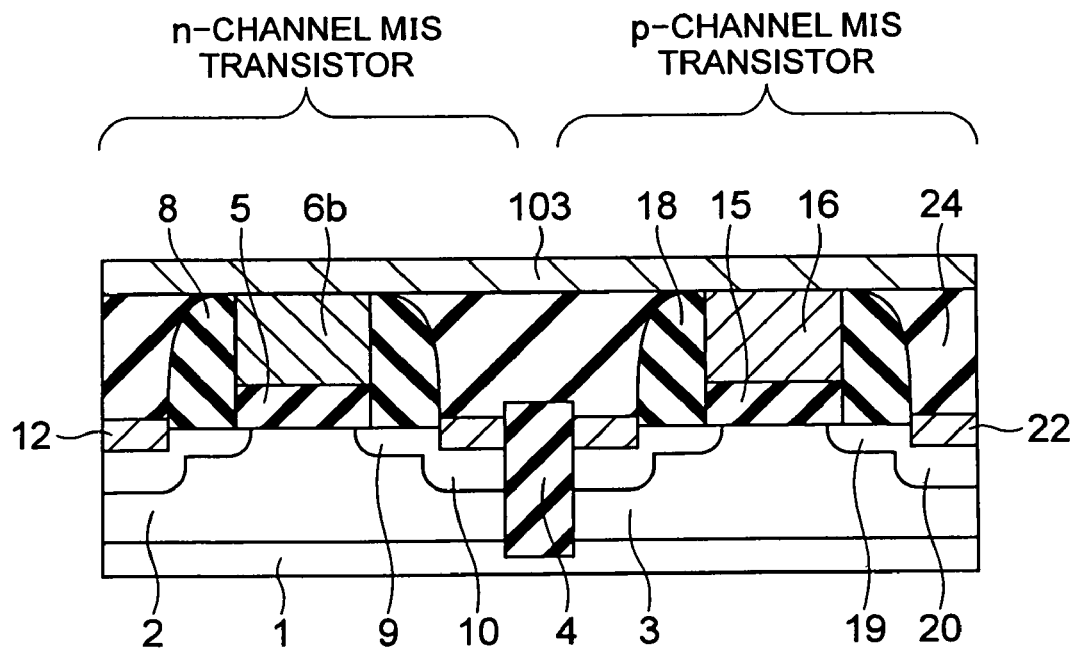

An aluminum layer 103 (a 30-nm thick aluminum layer in this embodiment) is formed on the entire surface of the structure shown in FIG. 14 by a sputtering technique, so as to obtain the structure shown in FIG. 15. Here, the film thickness of the aluminum layer 103 should be in the range of 3 nm to 50 nm. Since aluminum can be very easily oxidized, there is a possibility that all the aluminum is oxidized depending on the state after its deposition or the oxygen concentration in the heat treatment atmosphere, and an effective diffusion into the nickel silicide is hardly caused. The film thickness of the aluminum layer 103 is at 3 nm or greater, so that, even if the aluminum is oxidized, an aluminum oxide having excellent oxygen diffusion barrier properties is formed on the surface, and a metal aluminum layer of 1 nm to 2 nm in film thickness remains. With this amount of aluminum film, the threshold voltage can be sufficiently reduced when segregation is performed between the gate insulating film and the nickel silicide. On the other hand, if the aluminum layer 103 is too thick, an alloying reaction is caused with the nickel silicide, and the parasitic resistance becomes higher as the specific resistance becomes higher. As a result, the transistor characteristics deteriorate. Therefore, the film thickness of the aluminum layer 103 preferably should be 50 nm or smaller.

Heat treatment is then carried out at 450° C. for 30 minutes, so that the aluminum atoms are diffused from the aluminum layer on the n-channel MIS transistor toward the nickel silicide layer. The aluminum atoms are segregated at the interface with the gate insulating film 5, and then form the aluminum layer 6a (see FIG. 8). The unreacted portions of the aluminum thin film 103 are then removed with a liquid mixture of sulfuric acid and a hydrogen peroxide solution or an aqueous solution of hydrochloric acid, phosphoric acid, or acetic acid. As a result, the semiconductor device of this embodiment shown in FIG. 8 is obtained. Here, it is preferable that the heat treatment is carried out at a temperature between 400° C. and 600° C. Aluminum diffusion cannot be effectively caused at a temperature lower than 400° C., and the threshold voltage of the n-channel MIS transistor cannot be lowered. On the other hand, at a temperature higher than 600° C., a part of the aluminum segregated in the interface with the insulating film reduces the gate insulating film, or is thermally diffused into the gate insulating film. As a result, the properties of the insulating film might be greatly degraded. The heat treatment time is arbitrarily set for forming the requisite aluminum segregation layer.

In this embodiment, the aluminum layer 103 is deposited and is subjected to heat treatment, so as to diffuse aluminum into the Ni silicide layer 6b. However, instead of the deposition of an aluminum layer, aluminum ions may be implanted in the Ni silicide layer 6b, and may be diffused through heat treatment. In a case where an aluminum layer is deposited as described above, it is necessary to carry out the procedure of removing the excess aluminum film after the heat treatment for segregating the aluminum at the interface. On the other hand, in a case where aluminum ions are implanted, the procedure of removing the excess aluminum is not necessary, and the number of manufacturing procedures can be reduced accordingly. In such a case, however, measures need to be taken against aluminum implantation into the gate insulating film due to the energy struggling that is characteristic of ion implantation. This is because the leakage current is increased due to the damage to the gate insulating film, and the transistor characteristics are greatly degraded. To prevent this, the acceleration energy of the injection ions needs to be set at a low value. However, to lower the acceleration energy is to lower the injection current at the time of ion implantation. This leads to an increase in process time. Therefore, it is preferable that the aluminum layer is formed by a deposition technique.

In the structure of this embodiment, the Ni-FUSI of the n-channel MIS transistor is made of $Ni_2Si$, and its work function is approximately 4.7 eV. This is inappropriate for setting the threshold voltage Vth of the n-channel MIS transistor at a low value. However, by virtue of the effect of the aluminum segregated at the interface, the effective work function of the Ni-FUSI of the n-channel MIS transistor of this embodiment is reduced to 4.3 eV (see FIGS. 1 and 3). Accordingly, the threshold voltage Vth of the n-channel MIS transistor can be set at a low value.

Here, if an aluminum layer of one atomic layer (also referred to as one monolayer) is continuously formed in the in-plane direction in the interface between the $Ni_2Si$ and the gate insulating film HfSiON, its work function becomes effective, and the threshold voltage Vth of the n-channel MIS transistor is reduced. However, if the aluminum atom layer is discontinuous in the in-plane direction, the work function of such discontinuous portions is determined by the solid state properties of the $Ni_2Si$. As a result, the threshold voltage Vth varies among transistors, and variations in characteristics might be caused. Therefore, the thickness of the interface aluminum layer of this embodiment is one atomic layer in principle, but should preferably be 3 atomic layers or greater, with the characteristics variations due to incomplete processing or the like being taken into consideration. If the film thickness of the aluminum layer is greater than 3 atomic layers, the threshold voltage Vth can be effectively reduced. However, there is the trouble of segregating the excess aluminum at the interface.

In the structure of this embodiment, the Ni-FUSI of the p-channel MIS transistor goes through a phase transition to a $Ni_3Si$ composition that is richer in nickel. Accordingly, the effective work function of the interface becomes approximately 4.8 eV, and the threshold voltage Vth of the p-channel MIS transistor can be easily reduced. Under the above described heat treatment conditions, a sufficient amount of aluminum segregation for modulating the work function is not caused in the interface between the $Ni_3Si$ and the gate insulating film. In principle, the amount of aluminum segregated in the interface between the Ni-FUSI and the gate insulating film HfSiON of the p-channel MIS transistor needs to be smaller than one atomic layer (may be zero atomic layers). Otherwise, the high work function of $Ni_3Si$ is modulated by the work function of aluminum, and the threshold voltage Vth of the p-channel MIS transistor cannot be lowered. The aluminum layer should preferably be smaller than 0.1 atomic layers. With an aluminum layer of such a thickness, the work function of $Ni_3Si$ is hardly modulated, and the threshold voltage Vth can be certainly lowered accordingly. It is the most preferable that aluminum does not exist at all. However, as shown in FIG. 2, a certain amount of aluminum diffusion is caused in the case of $Ni_3Si$. Therefore, if aluminum reaches the interface, the amount of aluminum needs to be smaller than one atomic layer.

As described above, in accordance with this embodiment, it is possible to provide a semiconductor device that includes CMISs each having a low threshold voltage Vth and a Ni-FUSI/gate insulating film structure that can be easily manufactured, and a method for manufacturing the semiconductor device.

(Modification)

Figure 16:
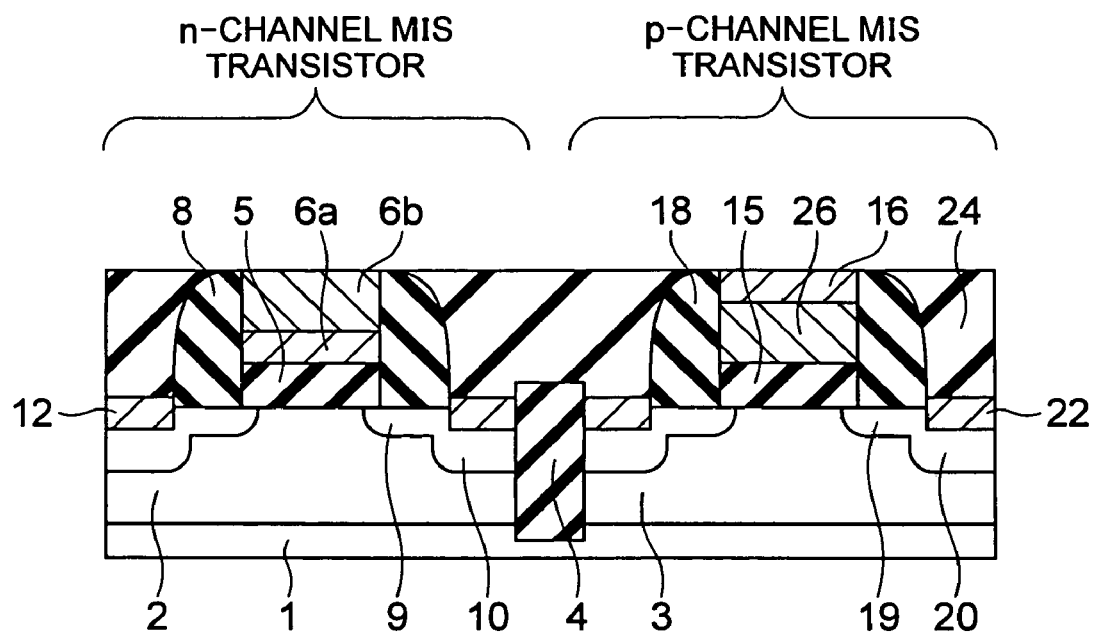
FIG. 16 is a cross-sectional view of a CMISFET according to a modification of the first embodiment.

FIG. 16 is a cross-sectional view of a CMISFET in accordance with a modification of this embodiment, taken along the gate length direction. The CMISFET of this modification differs from the CMISFET of this embodiment shown in FIG. 8 in that the gate electrode of the p-channel MIS transistor has a stacked structure of a $Ni_2Si$ silicide 26 and a nickel-rich silicide 16 ($Ni_3Si$, for example).

The structure shown in FIG. 16 is obtained by setting the film thickness of the nickel layer 70 at approximately 20 nm in the procedure for manufacturing the semiconductor device of this embodiment shown in FIG. 12, and carrying out the same procedures as those for manufacturing the semiconductor device of this embodiment in the later steps. In this modification, sufficient nickel cannot be supplied for converting all the $Ni_2Si$ into $Ni_3Si$, and only the upper layer goes through a phase transition to a nickel-rich $Ni_3Si$ layer. In this case, a $Ni_3Si$ layer 16 of approximately 30 nm is formed.

The $Ni_3Si$ layer 16 in this modification exhibits the effect of slowing down the aluminum diffusion relative to $Ni_2Si$ in the heat diffusion procedure after an aluminum thin film is deposited. Accordingly, the modification shown in FIG. 16 can be obtained.

In this modification, a part of the gate electrode of the p-channel MIS transistor is formed with a nickel silicide such as $Ni_2Si$, so as to lower the resistance of the gate electrode. While the specific resistance of NiSi or $Ni_2Si$ is in the range of 10 μΩcm to 25 μΩcm, the specific resistance of $Ni_3Si$ is as high as approximately 82 μΩcm. Accordingly, the parasitic resistance of the gate electrode can be lowered in this modification.

Also, $Ni_3Si$ causes a large increase in volume at the time of the formation of the $Ni_3Si$ layer. Therefore, the shape of the transistor might be destroyed in some cases. In this modification, the thickness of the nickel-rich silicide for restraining aluminum diffusion is minimized so as to avoid the above described problems, and precise LSI manufacture is realized without damage or destruction.

In this modification, the parasitic resistance can be reduced and the probability of transistor destruction can be lowered more effectively if the Ni₃Si layer is thinner. However, to slow down aluminum diffusion and not to modulate the work function of the interface between the Ni₂Si layer and the gate insulating film, the film thickness of the Ni₃Si layer should be 10 nm or more. To restrain aluminum diffusion with certainty, the Ni₃Si layer can be made thicker.

Like the first embodiment, this modification can provide a semiconductor device that includes CMISs each having a low threshold voltage Vth and a Ni-FUSI/high-k gate insulating film structure that can be easily manufactured, and a method for manufacturing the semiconductor device.

Second Embodiment

A method for manufacturing a semiconductor device in accordance with a second embodiment of the present invention is now described. The semiconductor device manufactured by the manufacturing method in accordance with this embodiment is a CMISFET that is substantially the same as the CMISFET of the first embodiment shown in FIG. 8.

First, the same structure as the structure shown in FIG. 9 is formed through the same manufacturing procedures as those of the first embodiment.

Figure 17:
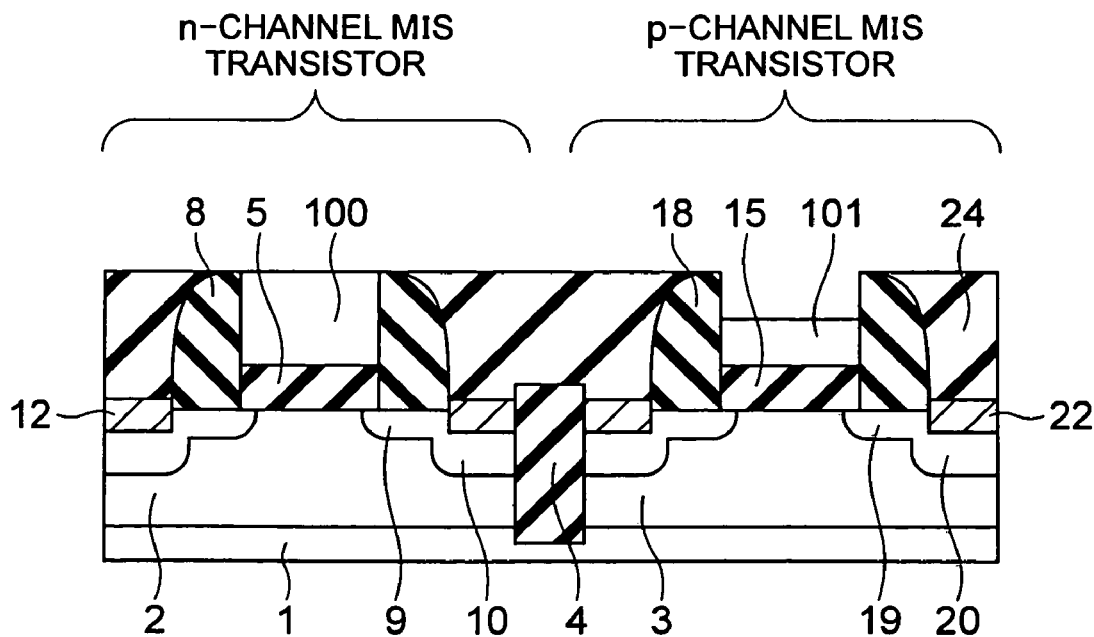
FIGS. 17 through 20 are cross-sectional views illustrating the procedures for manufacturing the CMISFET according to a second embodiment.

After that, a hard mask region (not shown) is formed on the n-channel MIS transistor by a conventional photolithography process. Wet etching using a standard alkali solution or the like or standard dry etching is performed, so as to thin only the silicon layer on the p-channel MIS transistor. In this manner, the structure shown in FIG. 17 is formed. Here, 25 nm of the 50-nm thick polycrystalline silicon layer 101 is removed by etching, so that a 25-nm thick polycrystalline silicon layer 101 remains.

Figure 18:
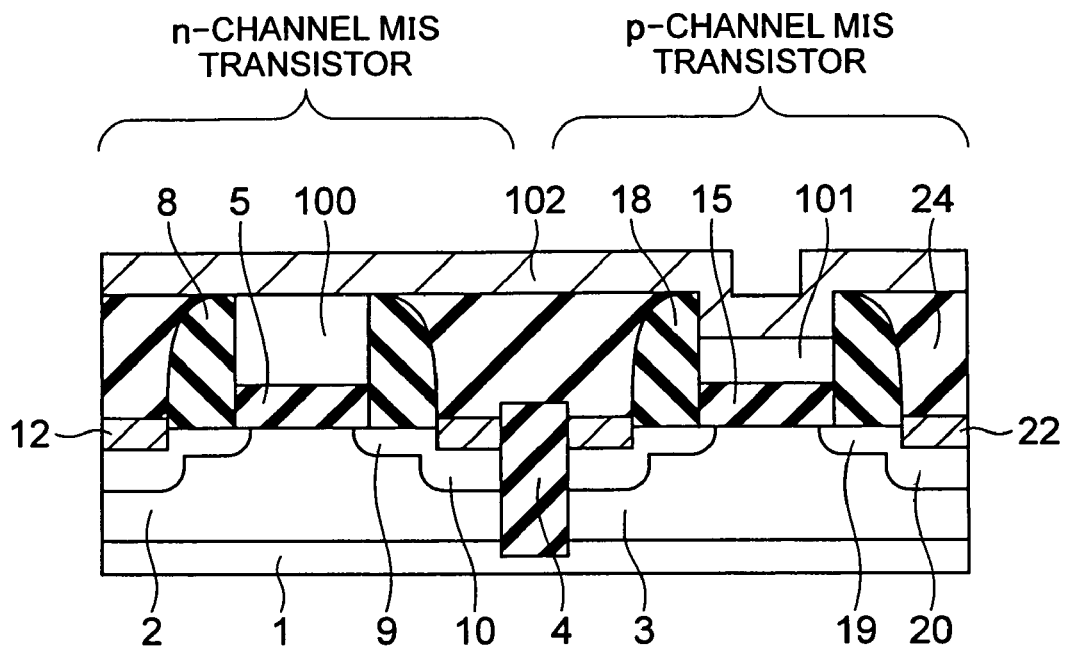

A Ni layer 102 of 50 nm in layer thickness is then deposited on the entire surface of the structure shown in FIG. 17, so as to obtain the structure shown in FIG. 18. The structure shown in FIG. 18 is then subjected to heat treatment, so that a solid phase reaction is caused between the Ni layer 102 and the silicon layers 100 and 101. Here, heat treatment is carried out at 500° C. for 30 seconds, for example. With such a film thickness ratio, the Ni₂Si layer 6b is formed on the n-channel MIS transistor, and the Ni₃Si layer 16 is formed on the p-channel MIS transistor. The unreacted Ni thin film is then removed with a liquid mixture of sulfuric acid and a hydrogen peroxide solution, so as to obtain the structure shown in FIG. 19.

Figure 19:
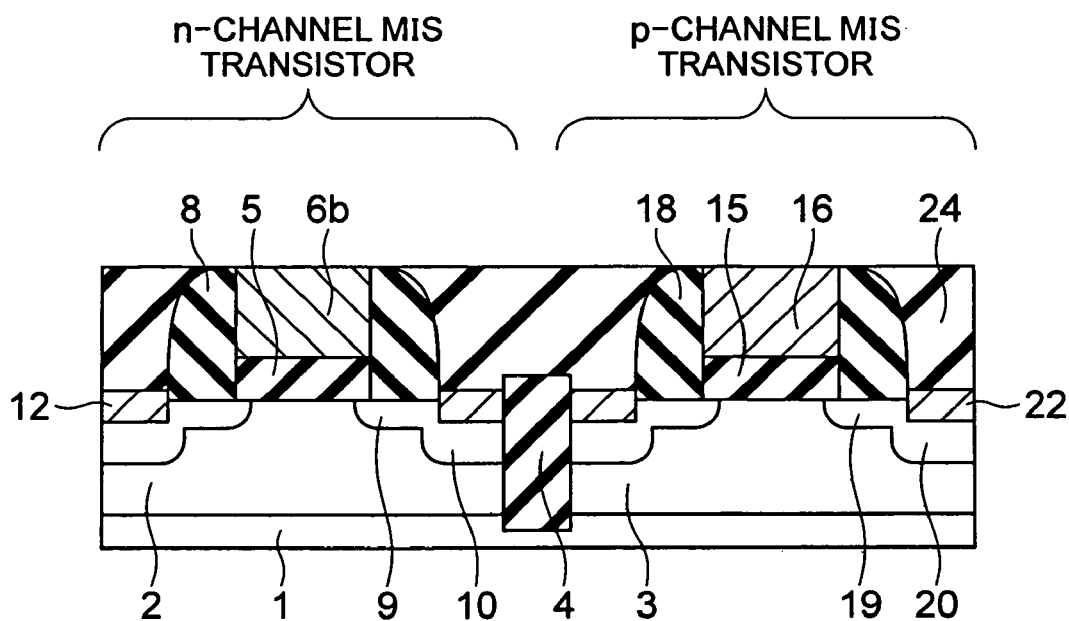
Figure 20:
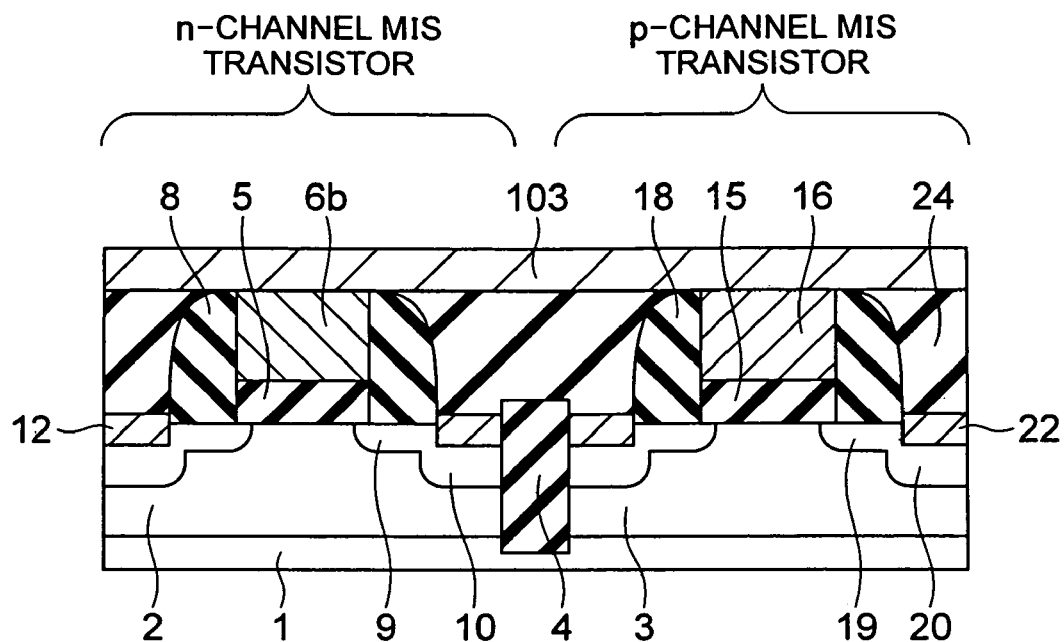

An aluminum layer 103 is then deposited on the entire surface of the structure shown in FIG. 19, so as to obtain the structure shown in FIG. 20. Here, a 30-nm aluminum thin film 103 is uniformly deposited by a sputtering technique. After that, aluminum diffusion is caused from the aluminum layer 103 toward the Ni silicide layer 6b by carrying out heat treatment at 450° C. for 30 minutes. By doing so, aluminum is segregated in the interface with the gate insulating film 5, and forms the aluminum layer 6a. At the time of this heat treatment, the aluminum diffusion is dramatically slowed down, as the silicide layer 16 is a Ni₃Si layer. The excess aluminum existing on the wafer is removed by etching with a liquid mixture of sulfuric acid and a hydrogen peroxide solution. At this point, etching is not performed on the nickel silicide layers 6b and 16. In this manner, the structure shown in FIG. 8 can be realized. In this embodiment, the aluminum layer 6a has a layer thickness of one atomic layer or greater, as in the first embodiment. However, there is a possibility that an aluminum layer thinner than one atomic layer (which may be zero atomic layers) that does not modulate the work function of the Ni₃Si is segregated between the silicide layer 16 and the gate insulating film 5.

In this embodiment, the aluminum layer 103 is deposited and is subjected to heat treatment, so as to diffuse aluminum into the Ni silicide layer 6b. However, instead of the deposition of an aluminum layer, it is possible to implant aluminum ions and diffuse the aluminum ions through heat treatment.

By the manufacturing method in accordance with this embodiment, different nickel silicide compositions are prepared for the gate electrodes of the n-channel MIS transistor and the p-channel MIS transistor. After that, an aluminum layer is deposited on the entire surface of the wafer and is thermally diffused, so that a sufficient amount of aluminum to modulate the work function can be segregated only in the interface between the gate insulating film and the gate electrode of the n-channel MIS transistor. In this manner, the formation of the nickel silicide and the segregation of aluminum can be carried out independently of each other. Accordingly, the process margin is increased, and high-performance LSI manufacture is facilitated. Also, based on the findings made by the inventors that Al diffusion is difficult in a Ni-rich Ni silicide layer, aluminum can be segregated only in the n-channel MIS transistor without a hard mask process.

As described above, in accordance with this embodiment, it is possible to provide a semiconductor device that includes CMISs each having a low threshold voltage Vth and a Ni-FUSI/high-k gate insulating film structure that can be easily manufactured, and a method for manufacturing the semiconductor device.

(Modification)

Referring now to FIGS. 21 through 25, a manufacturing method in accordance with a modification of the second embodiment is described.

Figure 21:
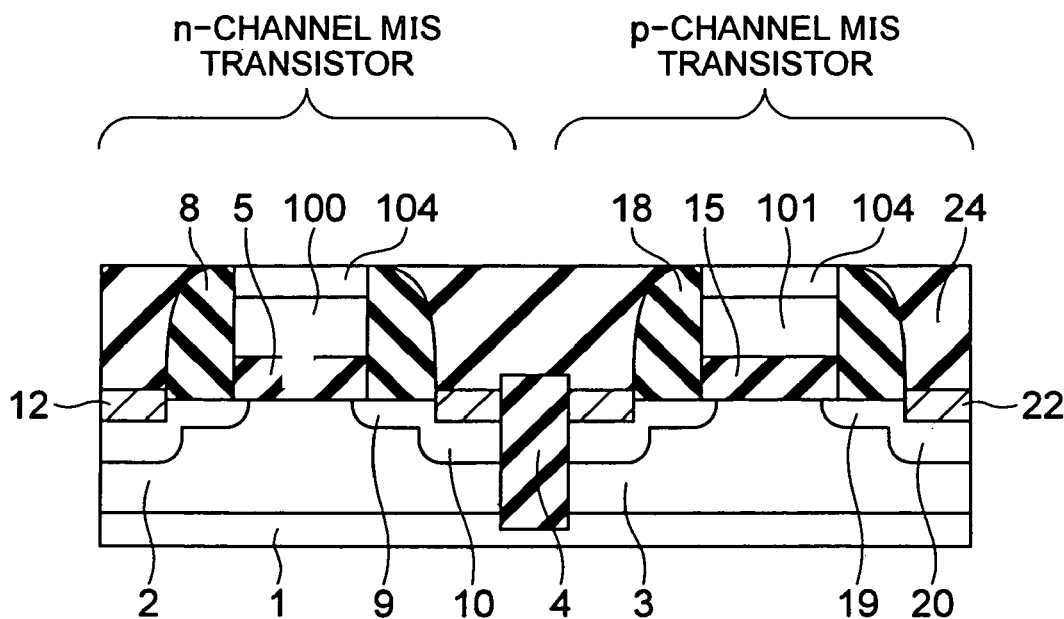
FIGS. 21 through 25 are cross-sectional views illustrating the procedures for manufacturing the CMISFET according to a modification of the second embodiment.

First, in the same manufacturing procedure as that of the first embodiment shown in FIG. 9, the gate electrodes are formed with stacked structures of polycrystalline silicon layers 100 and 101 of 50 nm in layer thickness and silicon germanium layers 104 of 15 nm in layer thickness (see FIG. 21). By virtue of the existence of the silicon germanium layers 104, in the oxide film etchback procedure for obtaining the structure shown in FIG. 21, the silicon layers 100 and 101 and the sidewall oxide films 8 and 18 can be controlled to have uniform heights.

Figure 22:
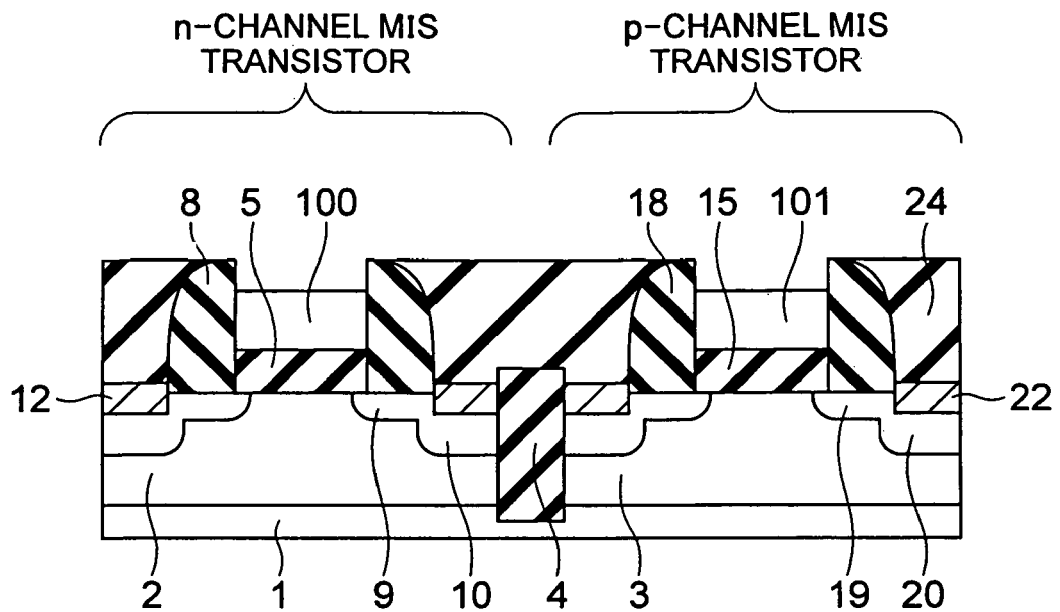

After that, the silicon germanium layers 104 are selectively removed by wet etching using a standard alkali solution or dry etching, so as to expose the surfaces of the polycrystalline silicon layers 100 and 101. In this manner, the structure shown in FIG. 22 is obtained.

The film thickness of the polycrystalline silicon layer 101 on the p-channel MIS transistor is then reduced by carrying out a conventional hard mask process. Here, the film thickness of the polycrystalline silicon layer 101 is reduced to 25 nm. In this manner, the structure shown in FIG. 23 is obtained.

Figure 23:
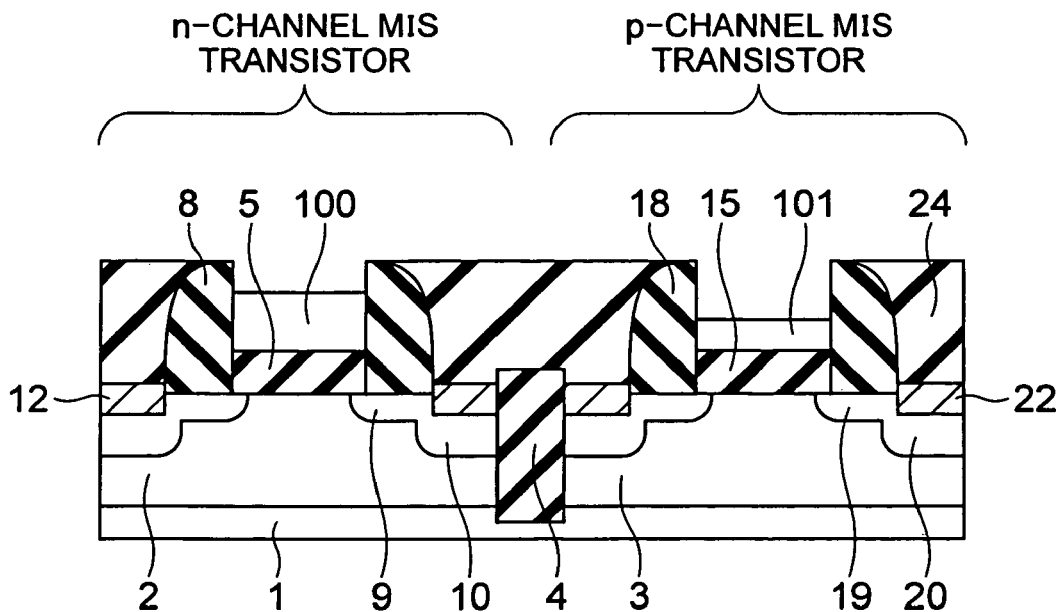
Figure 24:
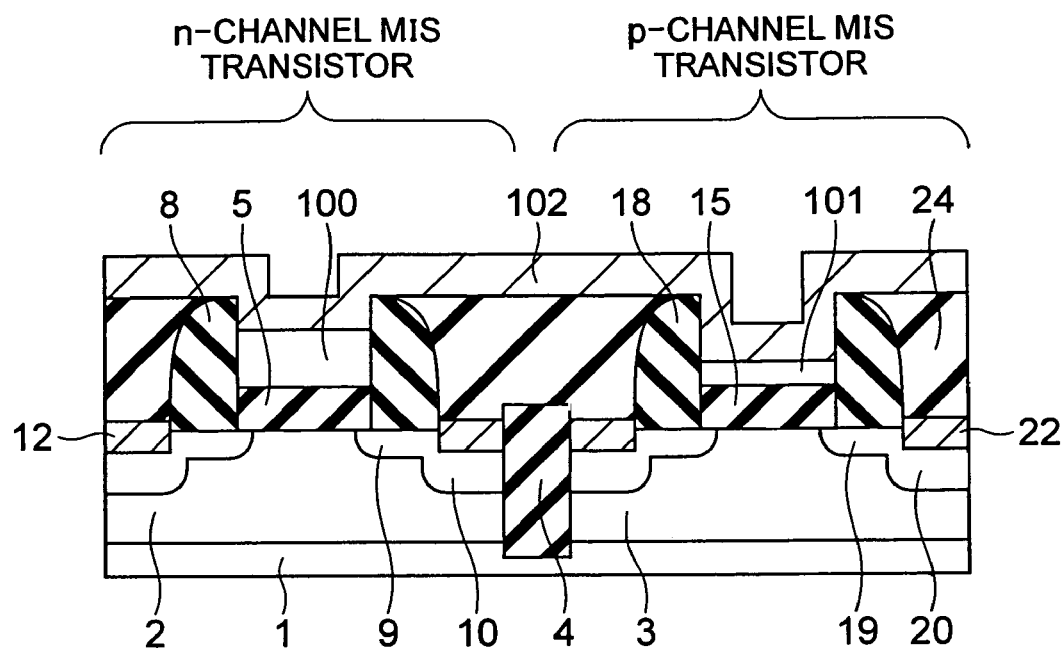

A 50-nm Ni layer 102 is then deposited on the entire surface of the structure shown in FIG. 23, so as to obtain the structure shown in FIG. 24. The structure shown in FIG. 24 is subjected to heat treatment, so that a solid phase reaction is caused between the Ni layer 102 and the silicon layer. Here, the heat treatment is carried out at 500° C. for 30 seconds, for example. With such a film thickness ratio, a Ni₂Si layer 6b is formed on the n-channel MIS transistor, and a Ni₃Si layer 16 is formed on the p-channel MIS transistor. The unreacted portions of the Ni thin film are then removed with a liquid mixture of sulfuric acid and a hydrogen peroxide solution, so as to obtain the structure shown in FIG. 25.

Figure 25:
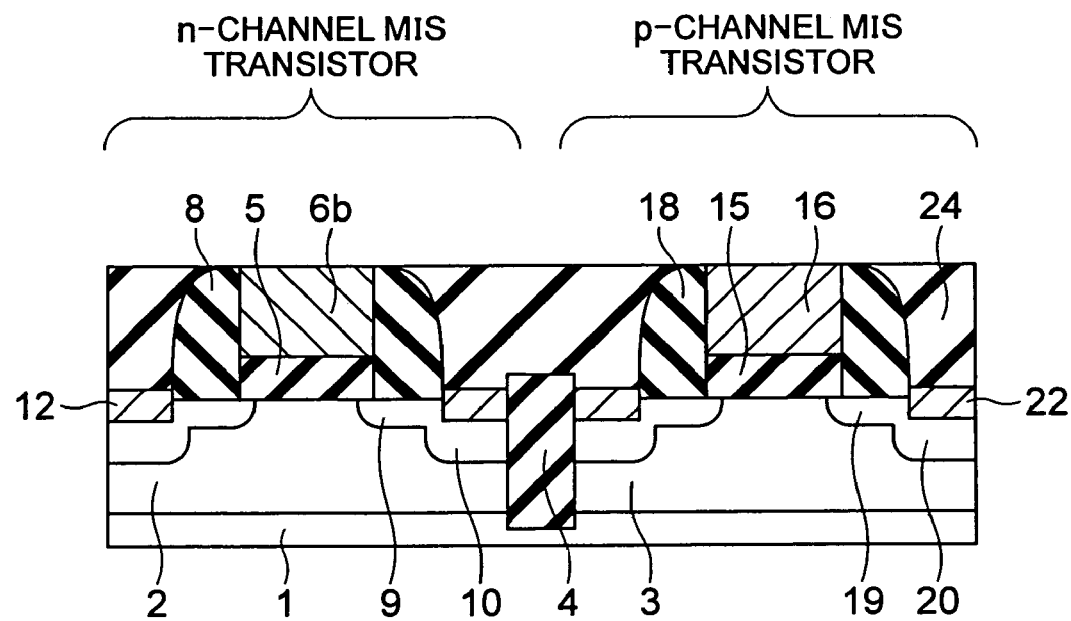

Aluminum ions are then implanted in the entire surface of the structure shown in FIG. 25 with an injection amount of $1 \times 10^{16}$ cm$^{-2}$ and an acceleration energy of 5 keV. Heat treatment is then carried out at 500° C. for 30 minutes, to cause aluminum diffusion. In this manner, aluminum is segregated at the interface with the gate insulating film 5, and forms the aluminum layer 6a. At the time of this heat treatment, the aluminum diffusion is greatly slowed down, as the silicide layer 16 is a Ni$_3$Si layer. In this manner, the structure shown in FIG. 8 can be realized.

The amount of aluminum to be injected needs to be $1 \times 10^{15}$ cm$^{-2}$ or more, so as to form the segregation layer 6a of one atomic layer or greater. Also, the acceleration energy should preferably be set so that the ion projected range in the nickel silicide becomes ⅔ or less of the film thickness of the nickel silicide layer. With this arrangement, the implanted aluminum can be prevented from reaching the gate insulating film 5.

The heat treatment for diffusing aluminum should preferably be carried out at a temperature between 400° C. and 600° C. Aluminum diffusion cannot be effectively caused at a temperature lower than 400° C., and the threshold voltage of the n-channel MIS transistor cannot be lowered. On the other hand, at a temperature higher than 600° C., a part of the aluminum segregated in the interface with the insulating film reduces the gate insulating film, or is thermally diffused into the gate insulating film. As a result, the properties of the insulating film might be greatly degraded.

By the method in accordance with this modification, a stacked structure of SiGe/Si is used so as to efficiently prepare the different nickel silicide compositions to form the gate electrodes of the n-channel MIS transistor and the p-channel MIS transistor. Accordingly, the thickness of each silicon layer prior to the silicide formation can be controlled with high precision. Thus, the different silicide structures can be easily formed in the n-channel and p-channel MIS transistor regions.

As the nickel silicide forming process and the aluminum segregating process are carried out independently of each other, the process margin is increased, and the aluminum diffusion in a Ni-rich Ni silicide layer becomes difficult. Based on those findings made by the inventors, the advantage of skipping the hard mask process or the like can be taken as in the second embodiment.

As described above, in accordance with each of the above described embodiments, it is possible to provide a semiconductor device that includes CMISs each having a low threshold voltage Vth and a Ni-FUSI/gate insulating film structure that can be easily manufactured, and a method for manufacturing the semiconductor device.

Although the embodiments of the present invention have been described so far, the present invention is not limited to those embodiments, and various changes may be made to them within the scope of the claimed invention. Also, those embodiments of the invention may be arbitrarily modified without departing from the gist of the invention. Further, the components disclosed in those embodiments may be arbitrarily combined to form various modifications.

What is claimed is:

1. A method for manufacturing a semiconductor device, comprising:
   forming a p-type semiconductor region and an n-type semiconductor region in a substrate;
   forming first and second gate insulating films on the p-type and n-type semiconductor regions, respectively;
   forming first and second metal layers on the first and second gate insulating films respectively;
   forming a third metal layer including aluminum on the first and second metal layers; and
   diffusing the aluminum through the first metal layer and diffusing the aluminum in the second metal layer by performing heat treatment, to segregate the aluminum at an interface between the first metal layer and the first gate insulating film.

2. The method according to claim 1, wherein the first metal layer has a composition in which aluminum can be more easily diffused as compared to a composition of the second metal layer.

3. The method according to claim 2, wherein the second metal layer has a stacked structure comprising a first metal film formed on the second gate insulating layer and a second metal film formed on the first metal film, the first metal film having a composition in which aluminum can be more easily diffused as compared to a composition of the second metal film.

4. The method according to claim 3, wherein a thickness of the second metal film is 10 nm or more.

5. The method according to claim 3, wherein the second metal film is formed of Ni$_3$Si.

6. The method according to claim 1, wherein the aluminum profile of the second metal layer in a depth direction is steeper than that of the first metal layer in a depth direction after the heat treatment.

7. The method according to claim 1, wherein the first metal layer is formed of the nickel silicide.

8. The method according to claim 1, wherein a thickness of the third metal layer is 3 nm or more and 50 nm or less.

9. The method according to claim 1, wherein an aluminum oxide is formed on a surface of the third metal layer.

10. The method according to claim 1, wherein the heat treatment is performed at a temperature between 400° C. and 600° C.

11. The method according to claim 1, wherein the first and second gate insulating films include at least one element selected from Hf, Zr, Ti and La.

12. The method according to claim 1, wherein the first and second gate insulating films include HfSiON layer.

13. The method according to claim 1, wherein the first and second gate insulating films include HfAlON layer.

14. The method according to claim 1, wherein the first and second gate insulating films include HfON layer.

15. The method according to claim 1, wherein the first and second gate insulating films include LaAlO layer.

16. The method according to claim 1, wherein the first and second gate insulating films include LaHfO layer.

17. The method according to claim 1, wherein the first and second gate insulating films are amorphous.

18. The method according to claim 1, wherein the aluminum segregated at the interface between the first metal layer and the first gate insulating film has a thickness of one atomic layer or greater after the heat treatment.

19. The method according to claim 1, wherein the aluminum segregated at the interface between the first metal layer and the first gate insulating film has a thickness of 3 atomic layers or greater after the heat treatment.

20. The method according to claim 1, wherein the aluminum at an interface between the second metal layer and the second gate insulating film has a thickness thinner than one atomic layer after the heat treatment.

21. The method according to claim 1, wherein the aluminum at an interface between the second metal layer and the second gate insulating film has a thickness thinner than 0.1 atomic layers after the heat treatment.

22. The method according to claim 1, wherein the semiconductor device is a CMISFET.

* * * * *